United States Patent [19]
Fukunaga et al.

[11] Patent Number: 5,412,314
[45] Date of Patent: May 2, 1995

[54] TESTING APPARATUS FOR SEMICONDUCTOR DEVICE FORMED ON TAPE CARRIER

[75] Inventors: Satoru Fukunaga; Junichirou Hisatomi, both of Tenri; Kazuhiro Nakamura, Ikoma; Ken'ichi Ohi, Osaka; Hideki Tanaka, Ashiya; Masayuki Tabuchi, Daito, all of Japan

[73] Assignee: Sharp Kabushiki Kaisha, Osaka, Japan

[21] Appl. No.: 6,306

[22] Filed: Jan. 22, 1993

[30] Foreign Application Priority Data

Feb. 7, 1992 [JP] Japan .................................. 4-022879

[51] Int. Cl.⁶ .......................................... G01R 31/28
[52] U.S. Cl. .................... 324/158.1; 324/73.1
[58] Field of Search ............ 324/158 P, 158 F, 158 R, 324/72.5, 158.1, 765, 73.1; 361/421; 437/8; 29/593; 414/222, 751, 417, 412; 209/573; 198/345, 397

[56] References Cited

U.S. PATENT DOCUMENTS

| | | | |
|---|---|---|---|
| 4,701,781 | 10/1987 | Sankhagowit | 357/70 |
| 4,801,561 | 1/1989 | Sankhagowit | 637/8 |
| 4,949,155 | 8/1990 | Tajma et al. | 357/68 |
| 4,956,605 | 9/1990 | Bickford et al. | 324/158 F |
| 4,962,356 | 10/1990 | Eberlein et al. | 324/158 P |
| 4,977,441 | 12/1990 | Ohtari et al. | 357/70 |
| 5,189,363 | 2/1993 | Bregman et al. | 324/158 F |
| 5,237,268 | 8/1993 | Honma et al. | 324/158 F |

FOREIGN PATENT DOCUMENTS

62-65500 3/1987 Japan .
3-95950 4/1991 Japan .

*Primary Examiner*—Vinh Nguyen
*Attorney, Agent, or Firm*—Nixon & Vanderhye

[57] ABSTRACT

A package tester includes an inlet station for arranging a test board in which package sockets mounting packages are disposed in one or plural lines for performing package test by flowing an electric current through the package and transmitting signals to the package, the package being composed of parts including electric parts or electronic parts and being sequentially formed on a package tape, an inlet pusher for pushing the test board mounting the packages by a width of the test board in a feeding direction of the test board from the inlet station to the package socket, a conveyor for receiving the test board sequentially pushed out of the inlet station by the inlet pusher and conveying the received test board to a testing area, a contact device opposed to the conveyor and capable of being electrically connected to the test board arranged on the conveyor, an outlet station receiving the test board sequentially pushed out of the conveyor by sequentially pushing-out of the test board by means of the inlet pusher, and a reaction urging device for allowing the test board to be pushed out while supporting the test board pushed out to the outlet station with force weaker than pushing out force in the inlet pusher.

17 Claims, 16 Drawing Sheets

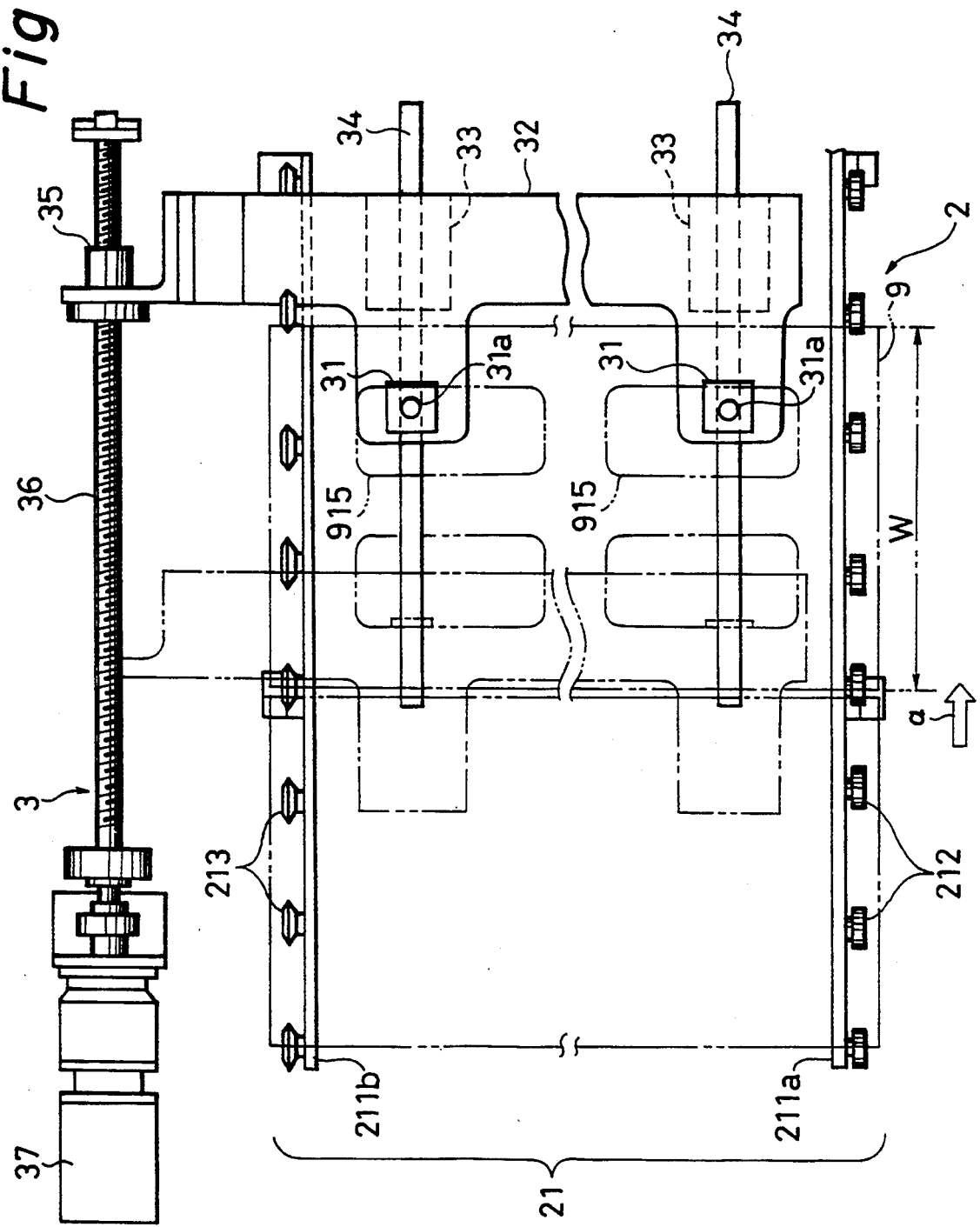

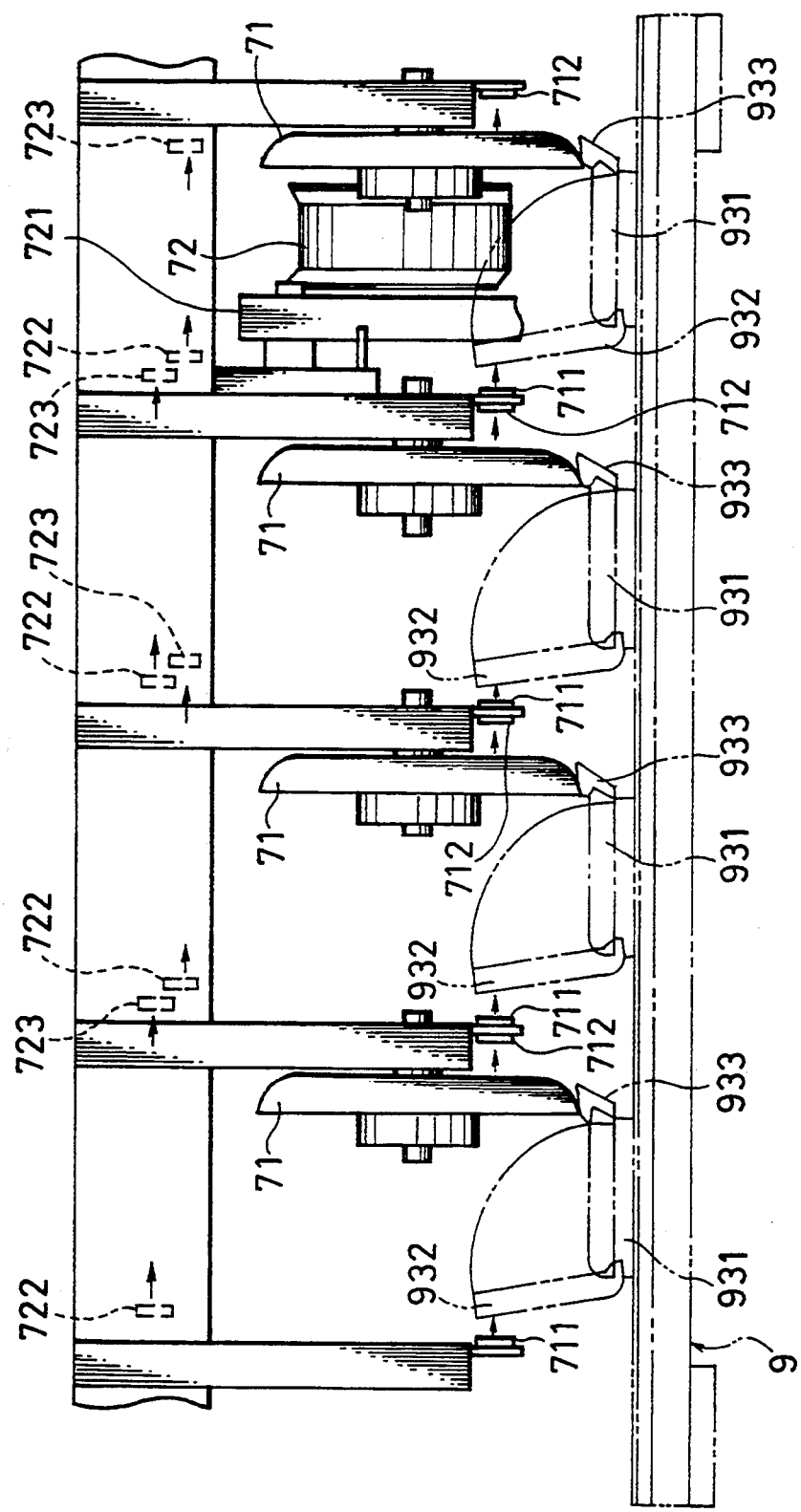

Fig.15a                    Fig.15b
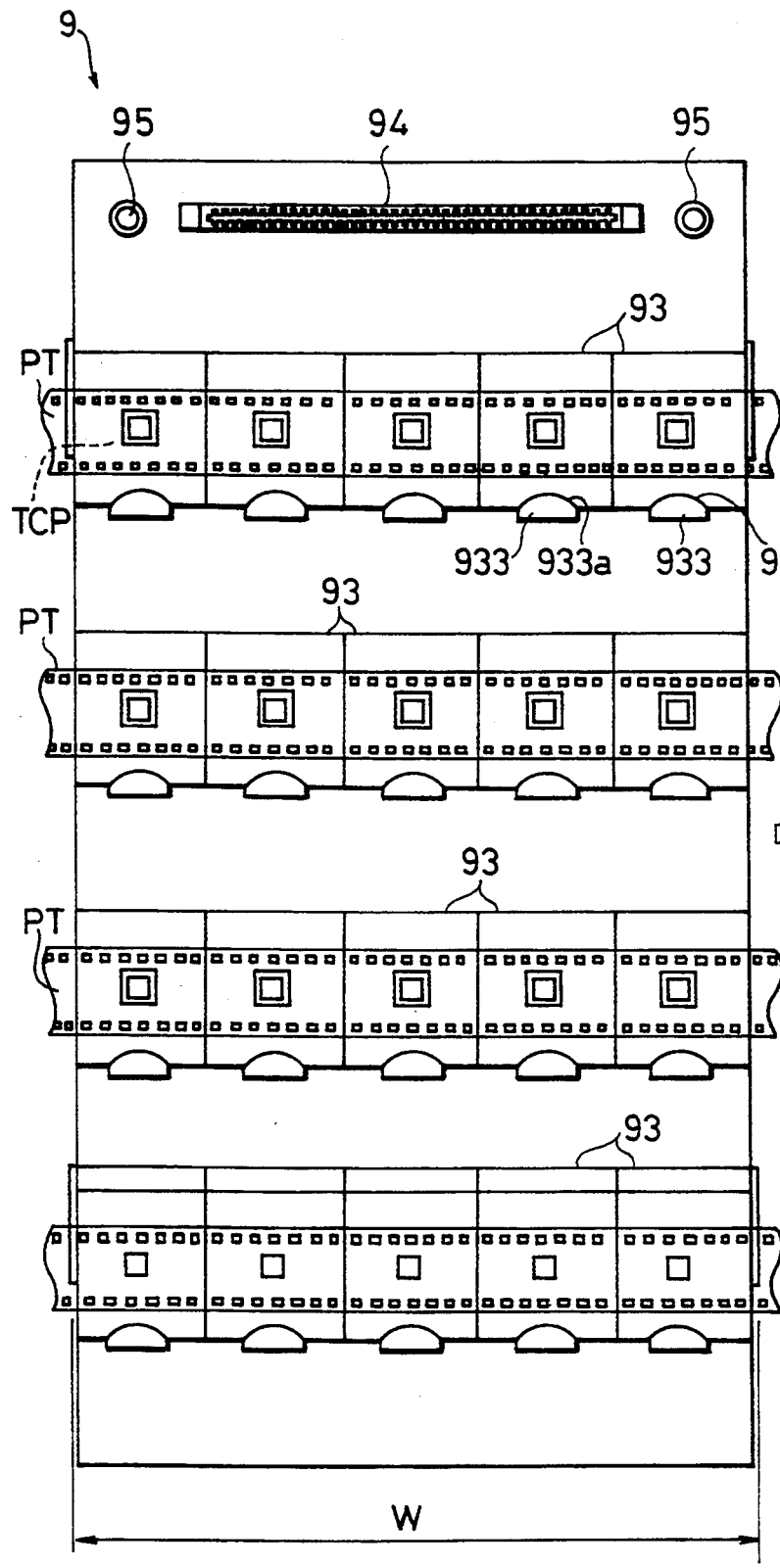
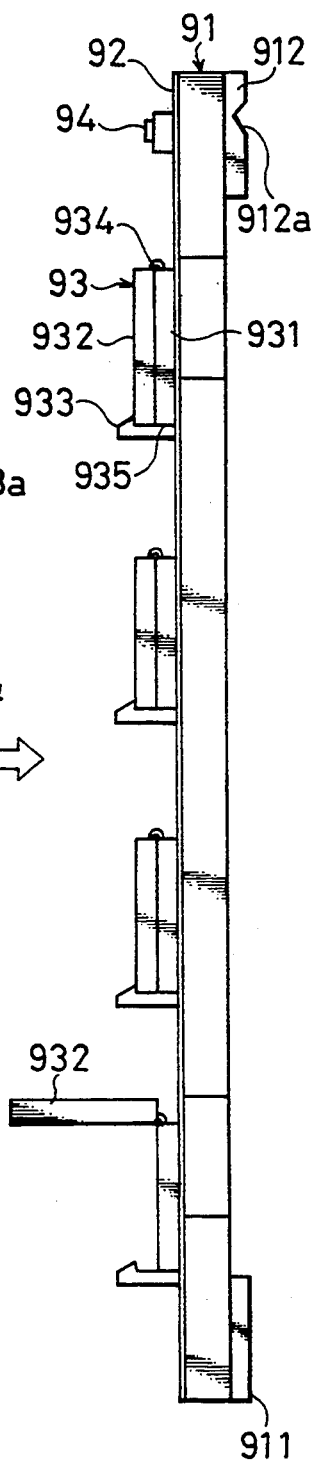

TESTING APPARATUS FOR SEMICONDUCTOR DEVICE FORMED ON TAPE CARRIER

BACKGROUND OF THE INVENTION

1. Field of the Invention

The present invention relates to a package tester for electric parts, electronic parts, etc., sequentially formed on a continuous tape and called a tape carrier package (TCP). The test occurs by applying an electric current through this package and transmitting signals, etc., to the package. The present invention also relates to a package tester for determining whether the package is good or bad in quality, and screening the package on the basis of the quality determinatior, etc.

2. Description of the Related Art

A package of electric parts, electronic parts, etc. (such as an IC package) can be individually formed as a unit. However, such a package can also be provided as a tape carrier package (TCP). This TCP is also called a TAB package and is normally formed on an elongated film made of synthetic resin. A package tape carries many packages and generally has several ten meters in length. The length of package tapes are expected to increase in the future.

The package tape normally has perforations in lug portions thereof. The perforations are used to feed and position the tape and are spaced from each other at a predetermined distance. Such a package tape is wound around a reel, etc. Each of the packages is tested by flowing an electric current therethrough and transmitting signals, etc. to each of the packages. In this package test, each of the packages is mounted onto a package socket.

When the package tape is cut in the shape of stripes to test a package, the cut package tape must be again connected to a series of package tapes (in many cases after the package test) so as to continuously feed the package tape to a next process. Such a connecting operation is troublesome. Further, no initial accuracy in each of positions of a lug hole, an electrode of each of the packages, etc. can be obtained with respect to the series of connected package tapes so that it is difficult to smoothly feed and position the package tapes in the next process. An area for sticking and connecting the package tapes to each other must be secured on the package tapes. Therefore, no packages at both ends of the cut package tape can be used so that yield of the packages is reduced.

It is also impossible to test a large amount of packages for a limited time in the above method in which the packages are sequentially tested one by one on the package tape without cutting the package tape.

Japanese Patent Application Laying Open (KOKAI) No. 2-275376 shows one method for solving such problems. In this method, package sockets are arranged in a spiral shape on a cylindrical supporting body. A package tape is continuously connected to this package socket line without cutting the package tape. However, in this method, the package tape is twisted so that the package tape and packages are damaged and reliability of the package test is reduced.

SUMMARY OF THE INVENTION

It is therefore an object of the present invention to provide a package tester for safely and efficiently testing a large amount of .packages on a package tape without cutting the package tape.

The above object of the present invention can be achieved by a package tester comprising an inlet station for arranging a test board in which package sockets mounting packages are disposed in one or plural lines for performing a package test by flowing an electric current and transmitting signals to each of the packages, each of the package being composed of parts including electric parts or electronic parts and being sequentially formed on a package tape, an inlet pusher for pushing the test board mounting the packages by a width of the test board in a feeding direction of the test board from the inlet station to the package socket, a conveyor for receiving the test board sequentially pushed out of the inlet station by the inlet pusher and conveying the received test board to a testing area, a contact device opposed to the conveyor and capable of being electrically connected to the test board arranged on said conveyor, an outlet station receiving the test board sequentially pushed out of the conveyor in accompanying with sequentially pushing-out of the test board by means of the inlet pusher, and a reaction urging device for allowing the test board to be pushed out while supporting the test board pushed out to the outlet station with force weaker than pushing out force in the inlet pusher.

Another object of the present invention is to provide a reel supporting device and a socket tape receiving device for the package tester to perform more efficiently the package test by using the package tester.

The above another object of the present invention can be achieved by a reel supporting device for a package tape comprising one or plural reel supporting arms arranged in parallel with each other such that a tape drawing-out reel can be rotatably mounted to one end portion of each of the reel supporting arms and a tape winding reel opposite to the tape drawing-out reel as a pair can be rotatably mounted to another end portion of each of the reel supporting arms, and an arm supporting means for rotatably supporting each of the reel supporting arms in an intermediate portion between both end portions of each of the reel supporting arms, and capable of selectively rotating and locating each of the reel supporting arms in a reel exchanging position or reel operation position, and a package tape receiving device comprising a latch driving means for sandwiching a package on a package tape between a socket body and a socket cover capable of opening and closing to the socket body, the latch driving member being opposed at a predetermined portion to a package socket track, a package socket which the socket cover being locked by a latch is conveyed sequentially on the package socket track, and for displacing the latch to an unlock position in accompanying with conveying of the package socket while abutting the latch at the lock position, a tape receiving means for receiving the package tape from the package socket which the latch is displaced to said unlock position, a tape guiding means disposed between the latch driving means and the tape receiving means for moving in response to receiving tension of the package tape, and a detecting means for detecting the tape guiding means locating at a predetermined moving limit position and stopping an operation of the tape receiving means.

In the above package tester, the package tape is drawn out of a tape supplying device and is mounted to the package socket on the test board in the inlet station. The test board having the package socket is sequentially pushed and arranged by the inlet pusher on the conveyor in the testing area. The contact device is electrically connected to the test board having the package tape to test the package. Thereafter, the next test board is pushed and fed by the inlet pusher to the outlet station.

In the outlet station, the test board is supported by a braking device for restricting inertial force of the pushed test board, and the reaction force applying device movable backward while the reaction force applying device supports the test board. Thereafter, a tape receiver receives the tested package tape from the test board. The empty test board is returned to the inlet station by a board return device. Each of the tape supplying device and the package tape receiver preferably includes the above reel supporting device.

Accordingly, in accordance with the above structure, a large amount of packages on the package tape can be tested efficiently and safely without cutting the package tape.

In reel supporting device, even if the tape drawing-out reels and the tape winding reels pairing with the tape drawing-out reels are disposed in plural, it is possible to compactly arrange them in parallel in a small space, to exchange easily the respective reels in the small space while saving trouble and to provide the reel supporting device at a low cost.

In package tape receiving device, the package tape can be automatically received safely from the package socket sequentially conveyed while sandwiching the package tape which the predetermined processing or test is performed.

Further objects and advantages of the present invention will be apparent from the following description of the preferred embodiments of the present invention as illustrated in the accompanying drawings.

BRIEF DESCRIPTION OF THE DRAWINGS

FIG. 3b is a view of the reel supporting device seen from a left-hand side in FIG. 3a;

FIG. 5b is a view of a tape guide plate in the tape guiding section seen from a right-hand side in FIG. 5a;

FIG. 6 is a plan view showing an inlet station and an inlet pusher disposed in this inlet station;

FIG. 8b is a cross-sectional view of the reaction force pusher taken along line I—I of FIG. 8a;

FIG. 10 is a view showing a latch driving roller and a tape guide roller (partially omitted) opposed as a pair to the latch driving roller seen from an upstream side of the test board in the feeding direction thereof;

FIG. 12b is a view showing the reel supporting device in the tape receiver seen from a left-hand side in FIG. 12a;

FIGS. 15a and 15b are respectively plan and side views of the test board; and

DESCRIPTION OF THE PREFERRED EMBODIMENTS

Figure 1:
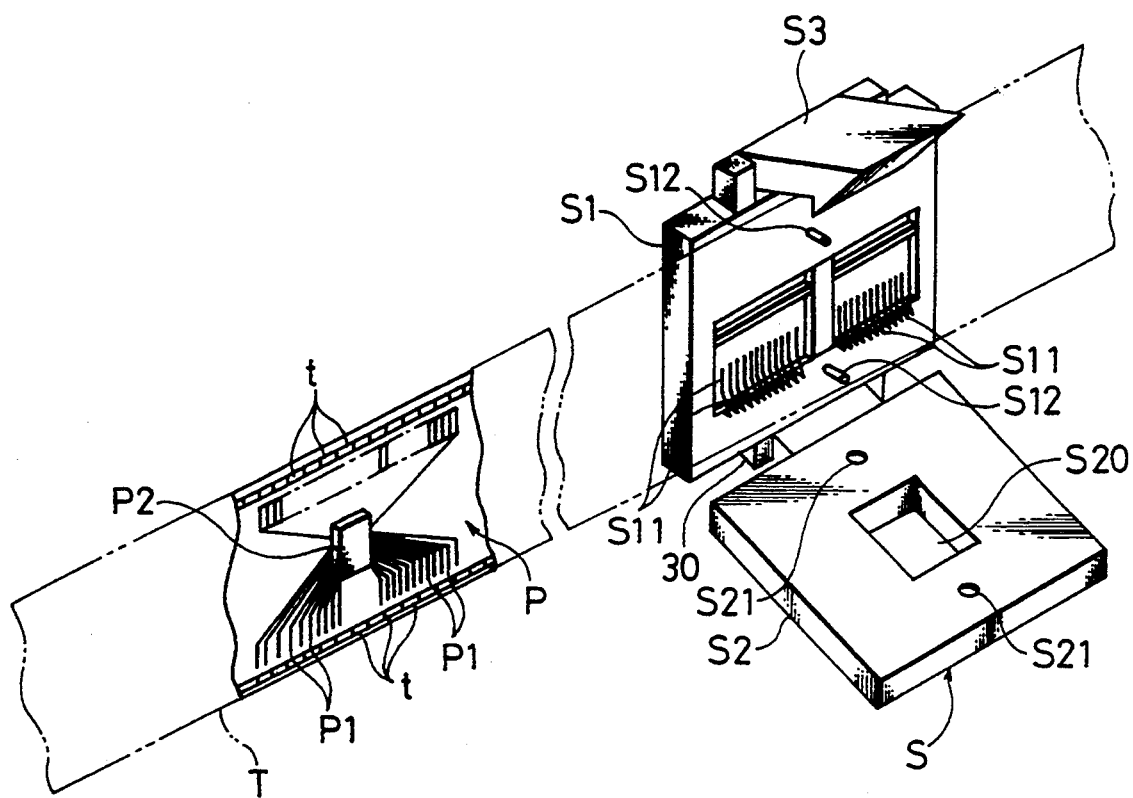
FIG. 1 is a perspective view showing a package tape and a general package socket for flowing an electric current through an IC package on the package tape and transmitting signals to the IC package.

The preferred embodiments of a package tester in the present invention will next be described in detail with reference to the accompanying drawings.

In the present invention, a package tester has an inlet station for arranging a test board in which a package socket for mounting a package composed of electric parts, electronic parts, etc. and sequentially formed on a package tape is arranged in one or plural lines to test the package by flowing an electric current through the package and transmitting signals to the package. The package tester also has an inlet pusher for pushing the test board mounting the package on the package socket from the inlet station by a width of the test board in a feeding direction thereof. The package tester also has a conveyor for receiving the test board sequentially pushed out of the inlet station by the inlet pusher and conveying the test board to a testing area. The package tester also has a contact device opposed to the conveyor and capable of being electrically connected to the test board arranged on the conveyor. The package tester also has an outlet station for receiving the test board sequentially pushed out of the conveyor by sequentially pushing the test board by the inlet pusher. The package tester further has a reaction force applying device for allowing the test board to be pushed out while the test board pushed to the outlet station is supported with force weaker than pushing-out force of the inlet pusher.

Such a package tester may further have a board return device for receiving the test board from the outlet station after the tested package is detached from the test board, and again conveying the received test board to the inlet station.

The board return device can be constructed as follows as one example.

Namely, the board return device includes an elevator device for receiving an empty test board in a position opposite to the outlet station and lowering and sending the empty test board. The board return device also includes a return conveyor for receiving the test board sent out of the elevator device and conveying the test board below the inlet station. The board return device further includes an elevator device for receiving the test board from the return conveyor in a position opposite to the return conveyor. The elevator device raises the test board until a position opposite to the inlet station. The elevator device then supplies the test board to the inlet station.

The package tester may have a tape supplying device for supplying the package tape in one or plural lines to the package socket of the test board in the inlet station, and may have a tape receiver for receiving the package tape having the tested package from the package socket of the test board in the outlet station. The package tester forms a continuous TCP tester when the package tester has the board return device, the tape supplying device and the taper receiver.

For example, it is considered that each of the package tape supplying device and the package tape receiver includes the following reel supporting device.

Namely, the reel supporting device for a package tape comprises one or plural reel supporting arms arranged in parallel with each other such that a tape drawing-out reel can be rotatably mounted to one end portion of each of the reel supporting arms and a tape winding reel opposite to the tape drawing-out reel as a pair can be rotatably mounted to another end portion of each of the reel supporting arms. The reel supporting device for a package tape further comprises arm supporting means for rotatably supporting each of the reel supporting arms in an intermediate portion between both end portions of each of the reel supporting arms, and capable of selectively rotating and locating each of the reel supporting arms in a reel exchanging position or a reel operating position.

In this case, for example, the tape drawing-out reel on a side of the tape supplying device is set to a reel for winding the package tape and a spacer tape for protecting this package tape in an overlapping state. The tape winding reel on the side of the tape supplying device is set to a reel for winding the spacer tape drawn in accordance with a drawing-out operation of the package tape. For example, the tape winding reel on a side of the tape receiver is set to a winding reel for winding the package tape having a tested package. The tape drawing-out reel on the side of the tape receiver is set to a reel for drawing out the spacer tape to be wound around the winding reel together with the package tape.

Each of the reel supporting arms may have a braking device for controlling rotation of the tape drawing-out reel caused by inertial force thereof in accordance with necessity. Each of the reel supporting arms may also have a driving device for rotating the tape drawing-out reel in a drawing-out operation in accordance with necessity. Further, each of the reel supporting arms may have a driving device for rotating the tape winding reel in a tape winding operation, and a braking device for braking the tape winding reel.

The inlet pusher may be constructed by using a piston-cylinder device and various kinds of link mechanisms such as a piston-crank mechanism, etc.

(1) The above reaction force applying device opposite to this inlet pusher may be constructed by a free roller conveyor, a free belt conveyor, a guiding device, etc. for providing potential energy for backward returning force to the test board pushed out of the testing area. The free roller conveyor, the free belt conveyor, the guiding device, etc. are disposed in the outlet station and are inclined upward.

(2) The reaction force applying device may be also constructed by a free roller conveyor disposed in the outlet station. A conveying speed of this free roller conveyor is equal to or lower than a pushing-out speed of the test board provided by the inlet pusher. When the test board is pushed at a speed equal to or higher than this conveying speed, the free roller conveyor can be braked by frictional force.

(3) The reaction force applying device may be also constructed by a reaction force applying means using a piston-cylinder device, a piston-crank mechanism, etc. This reaction force applying means can be moved backward in accordance with a pushing-out operation of the test board performed by the inlet pusher while the reaction force applying means supports the pushed test board.

(4) The reaction force applying device may be further constructed by suitably combining the above conveyors, devices, means, etc., with each other.

The above tape receiver may include a latch driving member and a tape receiving portion as one example when the package socket includes a socket body, a cover capable of being opened and closed with respect to the socket body, and a latch for locking this cover in a closing position. The latch driving member is located in a constant position opposed to an orbit of the package socket on the test board pushed out of the testing area in a state in which the package tape having a tested package is supported by the package socket. The latch driving member comes in contact with the latch as the package socket is fed. The latch driving member then displaces this latch to an unlocking position thereof. The tape receiving portion receives the package tape from the package socket in which the socket cover is opened or can be opened by displacing the latch to the unlocking position.

The tape receiver may also include a tape guide member arranged between the latch driving member and the tape receiving portion. The tape guide member can be moved in accordance with tensile force for receiving the package tape. Further, the tape receiver may include a means for detecting that the tape guide member is located in a predetermined moving limit position. This detecting means stops a tape receiving operation of the tape receiving portion by this detection.

Further, a detecting means for confirming an opening state of the socket cover may be disposed in a latch releasing position provided by the latch driving member, or a downstream position of the package socket located in a feeding direction thereof and adjacent to the latch releasing position. Movements of all or a portion of the tape receiving portion and the other movable constructional portions may be stopped by this detecting means when this detecting means does not detect the opening state of the socket cover.

For example, the latch driving member may be constructed by a fixed member or a rotatable roller member arranged in a constant position and opposed to a forward moving orbit of the package socket, i.e., a forward moving orbit of the latch of the package socket. When the package socket is fed, the latch comes in contact with the fixed member or the rotatable roller member so that the latch is pushed in an unlocking direction thereof.

The tape receiving portion is typically composed of a constructional portion including the tape winding reel.

The tape guide member may be constructed by a dancer member fixedly supported by a swinging arm, a dancer roller rotatably supported by the swinging arm, etc.

A means for detecting the predetermined moving limit position of the tape guide member and the detecting means for confirming the opening state of the socket cover can be constructed by using various kinds of detecting means composed of a mechanical switch such as a limit switch, a switch using magnetic force, an optical detecting switch, etc.

For example, the tape receiving operation of the tape receiving portion can be stopped on the basis of the detection of the tape guide member by inputting a detecting signal from the detecting means to a control section of the package tester, and giving commands for stopping this tape receiving operation from the control section while the detecting signal is inputted to this control section.

A shape of the latch of the package socket is desirably formed to more effectively operate the tape receiver such that the latch is smoothly displaced to the unlocking position by the latch driving member. For example, at least a portion of the latch firstly coming in contact with the latch driving member is formed in a shape in which this latch portion is gradually projected from a downstream side to an upstream side in the feeding direction of the package socket. Concretely, this latch portion may have a projected curved surface, a slanting face, etc.

The resilient force of a spring is desirably applied to the socket cover in an opening direction at any time such that the socket cover is automatically opened by releasing the latch.

Predetermined temperature and humidity for the package test may be secured by surrounding the testing area by a constant temperature oven, or a constant temperature and humidity oven in accordance with necessity.

In accordance with the package tester of the present invention, test boards having no package tapes are first continuously arranged from the inlet station to the outlet station in a state in which adjacent test boards come in contact with each other.

When a package tape is drawn from the package tape supplying device, etc. to the inlet station as mentioned above in a process prior to the package test during a package manufacturing process, a package on the package tape is mounted by an operator or a suitable mounting means onto the package socket on a test board in a standby state in the inlet station.

The test board having the package tape or the package is pushed onto a conveyor in the testing area by a width of the test board in the feeding direction thereof by using the inlet pusher. At this time, the reaction force applying device applies supporting reaction force to a test board pushed out of this conveyor in the testing area on a side of the outlet station. Thus, adjacent test boards arranged on the conveyor in the testing area are maintained in a state in which the adjacent test boards come in contact with each other.

When the test board is pushed out of the conveyor in the testing area, an empty test board in the outlet station is removed and returned to the inlet station by an operator or a suitable removing means in accordance with necessity. Otherwise, the empty test board may be conveyed to the inlet station by the above-mentioned board return device. Further, the empty test board may be separately arranged in the inlet station to wait for a mounting operation of the next package tape.

Thus, the test board having the package tape is sequentially pushed from the inlet station to the testing area. Accordingly, a predetermined number of test boards having package tapes are arranged in the testing area in a state in which adjacent test boards come in contact with each other. The tape drawing-out operation and the pushing-out operation of the test boards using the inlet pusher are once stopped. In the testing area, contact devices are electrically connected to the test boards having the package tapes. A predetermined electric current then flows through an IC package, etc. on each of the test boards and a signal is transmitted to this IC package, etc., thereby testing the package.

After the package test is performed at one time with respect to the plural test boards in the testing area, the contact devices are electrically disconnected from the respective test boards and the test boards having the package tapes are again sequentially pushed from the inlet station onto the conveyor in the testing area. A predetermined number of test boards having the package tapes are then arranged on this conveyor and the package test is again repeated.

Thus, the test boards holding the tested package tapes are pushed from the testing area to the outlet station as the test boards having the packages to be next tested are sequentially pushed to the testing area. Each of the package tapes on the test boards pushed to the outlet station is pulled out of the package socket by the above tape receiver, etc. in the next process.

When the board return device is disposed, an empty test board is conveyed to the inlet station by the board return device.

FIG. 1 shows one example of a package socket. As shown in FIG. 1, the package socket generally has a socket body S1 and a socket cover S2 connected to the socket body S1 by a hinge, etc. such that the socket cover S2 can be opened and closed. The package socket further has a latch S3 for locking the socket cover S2 in a closing position thereof. In this example, the latch S3 is connected to the socket body S1 by a hinge.

The socket body S1 has an electrode S11 for applying an electric current through a package P on a package tape T and transmitting signals, etc. to the package P. The socket body S1 also has a pin S12 for positioning the package P by the fitting operation with a lug hole t of the package tape T.

The socket pin S12 is fitted into the lug hole t such that an electrode P1 of the package P on the package tape T comes in contact with the socket electrode S11. Thus, the package P on the package tape T is arranged in the socket body S1. Next, the socket cover S2 is closed and is locked by the latch S3 so that the package P is set in the socket S and is tested. A chip P2 of the package P is fitted into a hole S20 of the socket cover S2 and the socket pin S12 is fitted into a hole S21.

The package socket S is normally arranged in one or plural lines in a longitudinal direction of the package tape T on a wiring test board. One or plural package sockets S are included on each of the package socket lines.

Accordingly, the package tape T is cut in the shape of several stripes as a unit such that the package tape T includes packages corresponding to the number of package sockets on each of the package socket lines. The cut package tape is mounted onto the package socket lines. The test board mounting the package tape T cut in the shape of stripes is arranged at several stages in a testing area. Then, a predetermined electric current flows through each of packages P and signals are transmitted to each of the packages P through the test board and each of the package sockets S.

In addition to the above-mentioned testing method, there is another testing method in which the packages P on the package tape T are sequentially tested one by one without cutting the package tape T.

Figure 2:
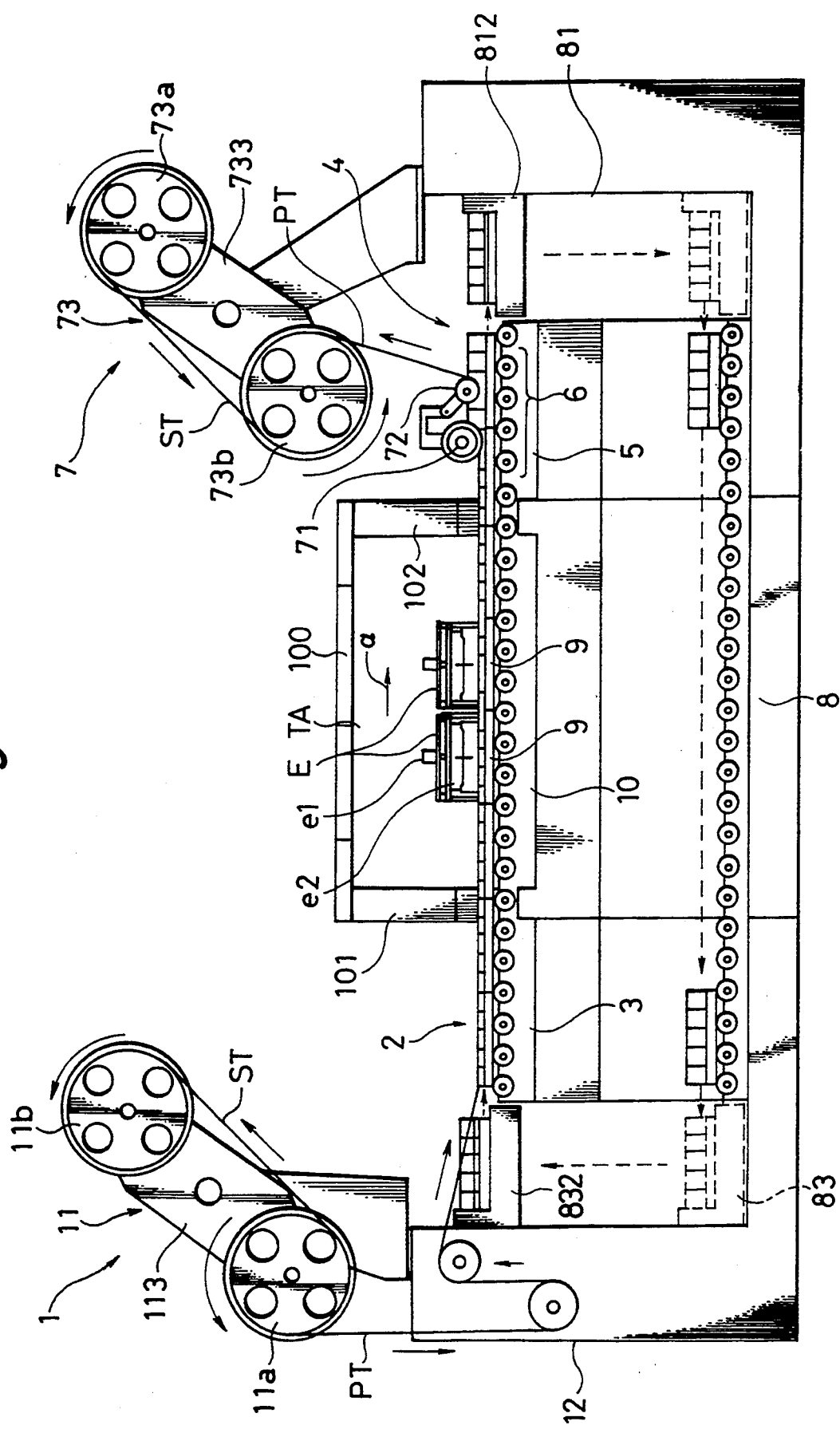
FIG. 2 is a schematic side view showing the entire construction of a package tester in accordance with one embodiment of the present invention.

FIG. 2 is a schematic side view of a tester for continuously testing a tape carrier package (TCP) in accordance with one embodiment of the present invention.

This continuous TCP tester has a tape supplying device 1 for supplying a package tape PT, an inlet station 2 adjacent to the tape supplying device 1, an inlet pusher 3 opposite to the inlet station 2, and a roller conveyor 10 disposed in a testing area TA adjacent to the inlet station 2. The continuous TCP tester also has a plurality of contact devices E which can be electrically connected to a test board 9 arranged on the roller conveyor 10.

The continuous TCP tester also has an outlet station 4 adjacent to the roller conveyor 10, and a reaction force pusher 5 opposite to the outlet station 4. The continuous TCP tester also has a reaction force applying braking device 6 disposed in the outlet station 4, and a tape receiver 7 opposite to the outlet station 4. The continuous TCP tester further has a board return device 8 for returning the test board 9 from the outlet station 4 to the inlet station 2.

The above constructional portions of the package tester will next be explained sequentially in detail.

The tape supplying device 1 will first be described. This tape supplying device 1 has a reel supporting device 11 for a package tape PT and a tape guiding section 12.

Figure 3A:
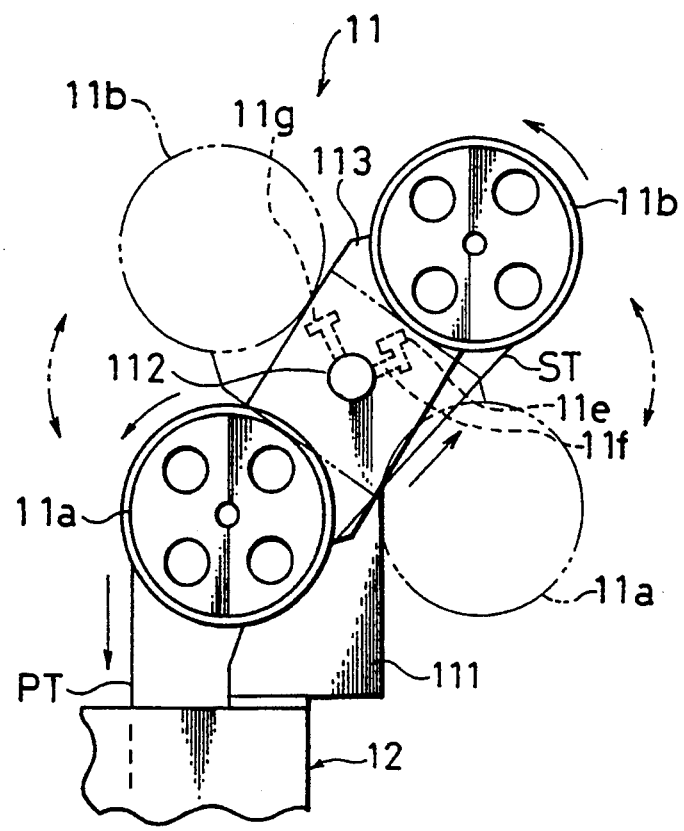
FIG. 3a is a side view of a reel supporting device in a tape supplying device.
Figure 3B:
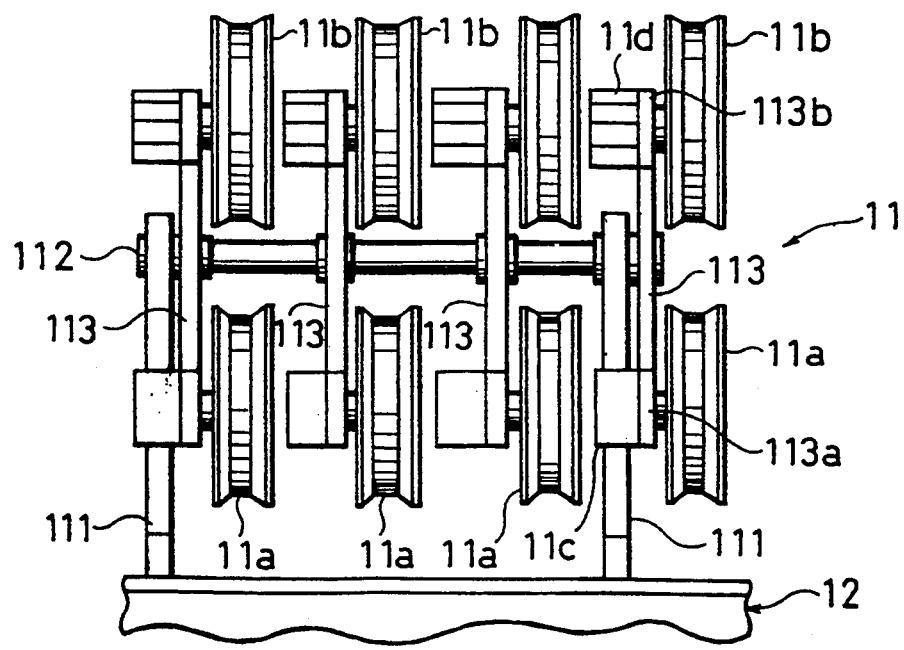

As shown in FIGS. 3a, and 3b the reel supporting device 11 has an : arm shaft 112 horizontally connected between a pair of pillars 111 vertically disposed in a top portion of the tape guiding section 12. The reel supporting device 11 also has four reel supporting arms 113 spaced along arm shaft 112 at a predetermined distance and parallel to each other and rotatably supported by the arm shaft 112. A tape drawing-out reel 11a can be mounted to one end portion 113a of each of the reel supporting arms 113. A tape winding reel 11b can be mounted to another end portion 113b of each of the reel supporting arms 113.

The mounted tape drawing-out reel 11a can be rotated by pulling a wound tape out of this tape drawing-out reel 11a. A braking device 11c using frictional resistance is disposed in one end portion 113a of each of the reel supporting arms 113. The braking device 11c prevents the tape drawing-out reel 11a from being excessively rotated by inertial force caused in a pulling-out operation of the tape. Further, a motor 11d is disposed at the other end portion 113b of each of the reel supporting arms to rotate the mounted tape winding reel 11b in a winding direction.

The braking device 11c and the motor 11d may each be constructed as a motor having a braking function.

Reel supporting arms 113 can each be independently rotated around the arm shaft 112 and moved to a reel detaching or exchanging position shown by a two-dotted line in FIG. 3a. Further, each of the reel supporting arms 113 can be independently rotated and returned from the reel detaching or exchanging position to a normal operating position.

As shown by broken lines in FIG. 3a, a projection 11e is disposed on one face of each of the reel supporting arms 113. Stoppers 11f, 11g are disposed in the arm shaft 112 such that these stoppers are opposed to an orbit of this projection 11e. The projection 11e and the stoppers 11f, 11g are omitted in FIG. 3b. The projection 11e comes in contact with the stopper 11f in the normal operating position and comes in contact with the stopper 11g in the reel detaching or exchanging position. The stopper means is not limited to the illustrated structure of stoppers 11f and 11g.

Each of the reel supporting arms 113 is manually rotated. Accordingly, a position for supporting each of the reel supporting arms 113 by the arm shaft 112 is selectively determined in consideration of weights of the arms, the reels, the tape, etc. such that each of the reel supporting arms 113 is simply and easily rotated with reduced labor and improved balance.

In accordance with this reel supporting device 11, the tape drawing-out reel 11a (mounted to one end portion 113a of each of the reel supporting arms 113) is provided to windingly discharge both a continuous elongated package tape PT (sequentially forming packages such as IC packages thereon) and a spacer tape ST (overlapped with package tape PT to protect package tape PT). As shown in FIG. 3a, the tape winding reel 11b (mounted to the another end portion 113b of each of the reel supporting arms 113) winds the spacer tape ST (drawn out together with a drawing-out operation of the package tape PT from the drawing-out reel 11a).

Figure 4:
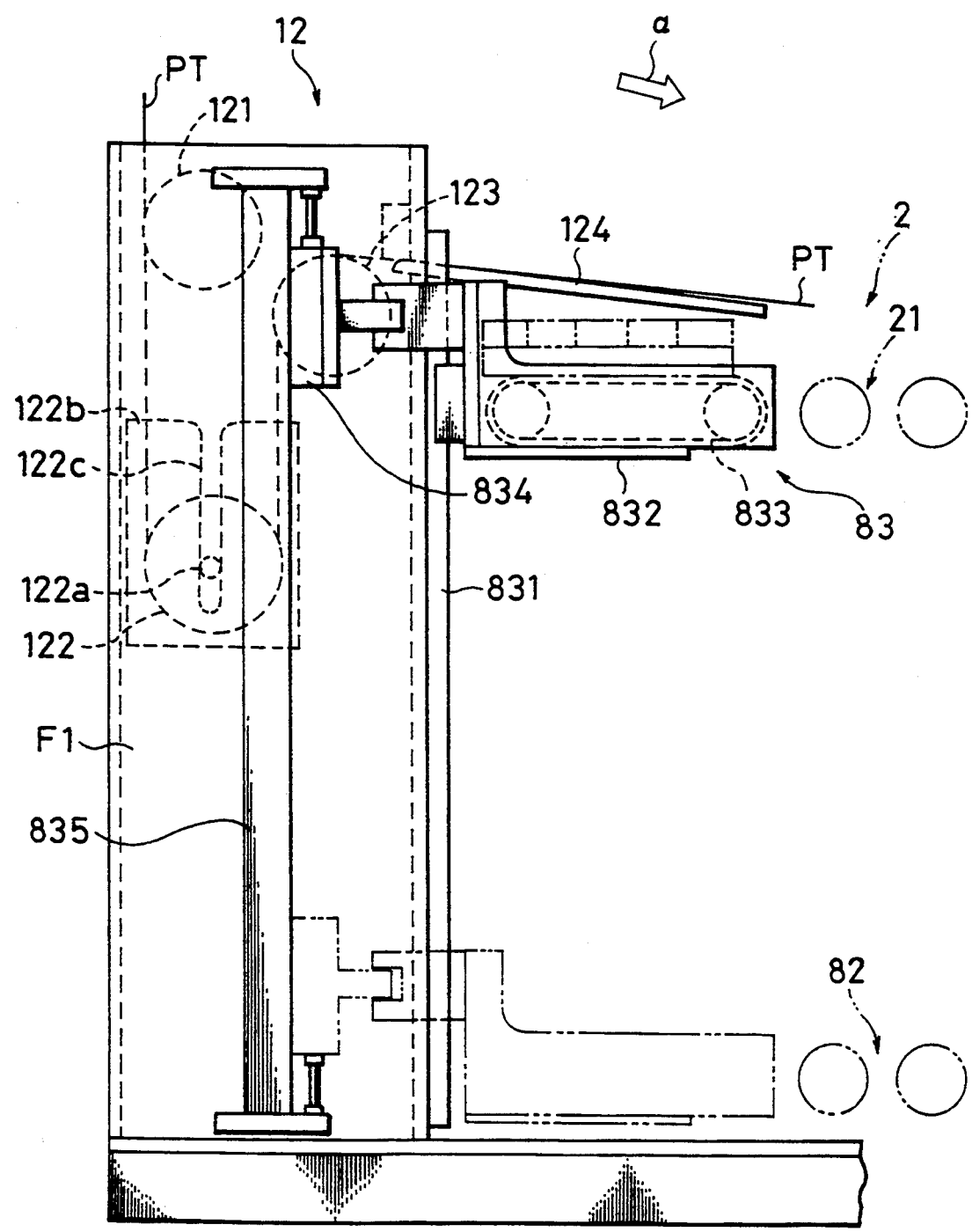
FIG. 4 is a side view showing a tape guiding section in the tape supplying device and a portion of a board return device.
Figure 5A:
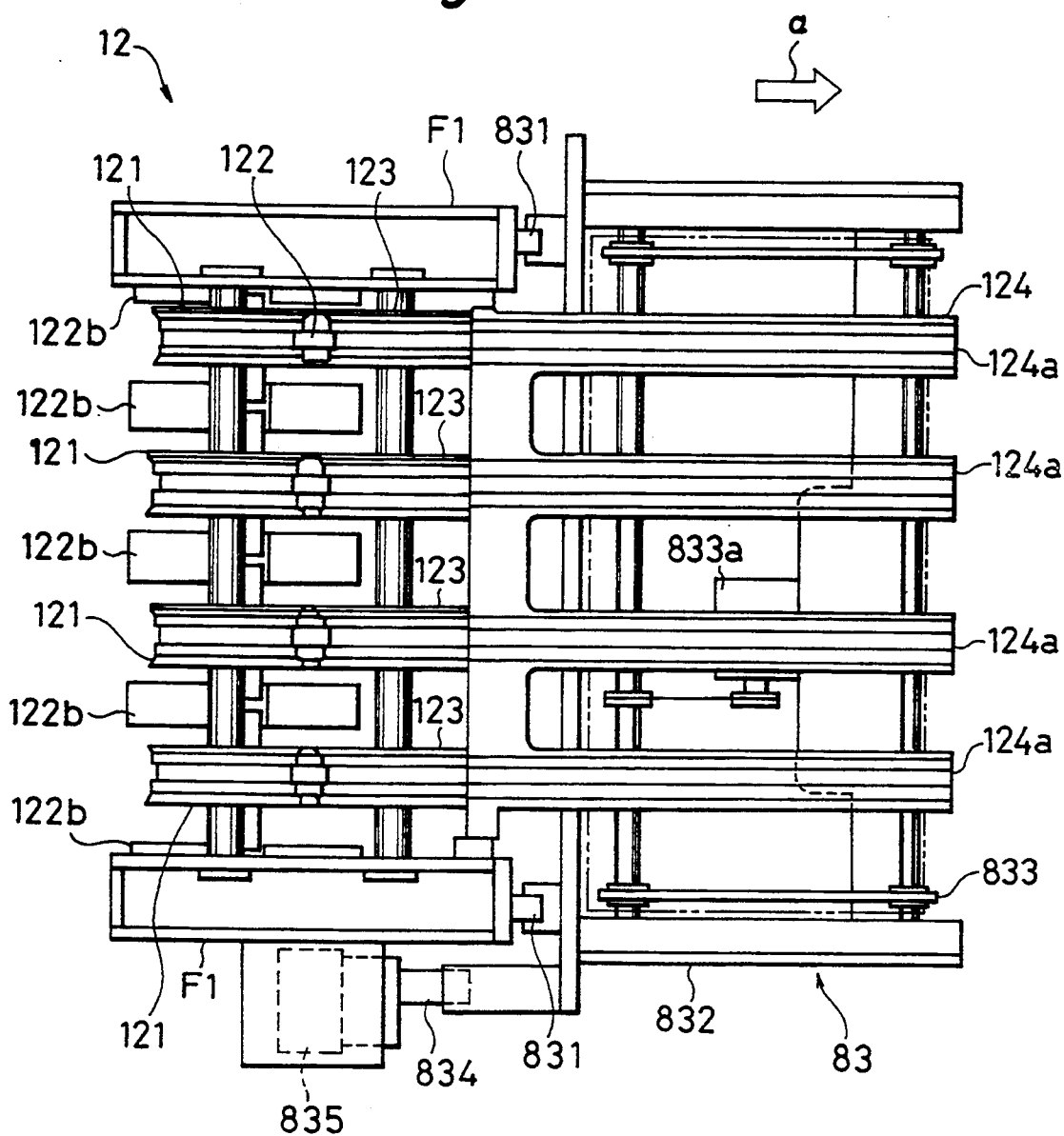
FIG. 5a is a plan view showing the tape guiding section in the tape supplying device and a portion of the board return device.
Figure 5B:
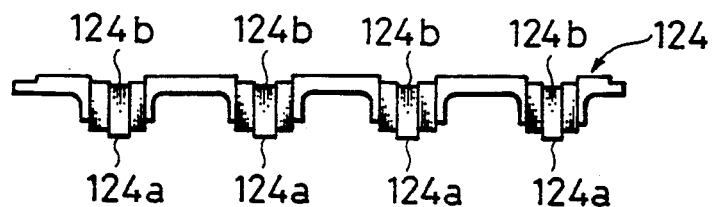

The tape guiding section 12 is shown in FIGS. 4 and 5 in detail. FIG. 4 is a side view showing the tape guiding section 12 and a portion of the board return device 8. FIG. 5a is a plan view showing the tape guiding section 12 and a portion of the board return device 8. FIG. 5b is a view showing a tape guide plate 124 of the tape guiding section 12 seen from a right-hand side in FIG. 5a.

Tape guiding section 12 has four tape guide rollers 121 rotatably disposed in an upper portion of a package tester frame F1 in an end portion of the package tester. The tape guiding section 12 also has a rotatable dancer roller 122 arranged below each of the tape guide rollers 121. The tape guiding section 12 also has a rotatable tape guide roller 123 arranged above each of the dancer rollers 122 and slightly in front of each of the dancer rollers 122. The tape guiding section 12 further has a tape guide plate 124 formed in the shape of a comb and inclined downward from a position opposite to the tape guide roller 123 toward inlet station 2.

Each of the dancer rollers 122 can be freely rotated and raised and lowered by fitting a roller shaft 122a into a longitudinal groove 122c disposed in a roller supporting body 122b such that the roller shaft 122a can be freely raised and lowered.

Each set of tape drawing-out roller groups is composed of one tape guide roller 121, the dancer roller 122 arranged below this tape guide roller 121 and the tape guide roller 123 arranged above this tape guide roller 121. Each set of the tape drawing-out roller groups is situated beneath the corresponding tape drawing-out reel 11a and the tape winding reel 11b of each set in the reel supporting device 11.

As shown in FIGS. 5a and 5b, each of the tape guide plates 124 is formed in the shape of a comb. Each of comb portions 124a of the tape guide plates 124 is opposite to the tape guide roller 123. As can be seen from FIG. 5b, each of the comb portions 124a has a central recessed portion 124b. This central recessed portion 124b is formed to guide and fit an IC chip, etc. on the package tape PT thereinto.

In accordance with tape guiding section 12, the package tape PT is pulled out of the tape drawing-out reel 11a supported by each of the reel supporting arms 113 in the reel supporting device 11. Package tape PT is then guided to a tape guide roller 121 corresponding to the tape drawing-out reel 11a and is rotated around the dancer roller 122. The package tape PT is raised from the dancer roller 122 and is guided to the tape guide roller 123 and to the tape guide plate 124 so that the package tape PT reaches the inlet station 2. When excessive tensile force is applied to the pulled package tape PT, the dancer roller 122 is freely raised by this tensile force so that it is possible to protect the package tape from being damaged.

The inlet station 2 and the inlet pusher 3 will next be described.

Figure 7:
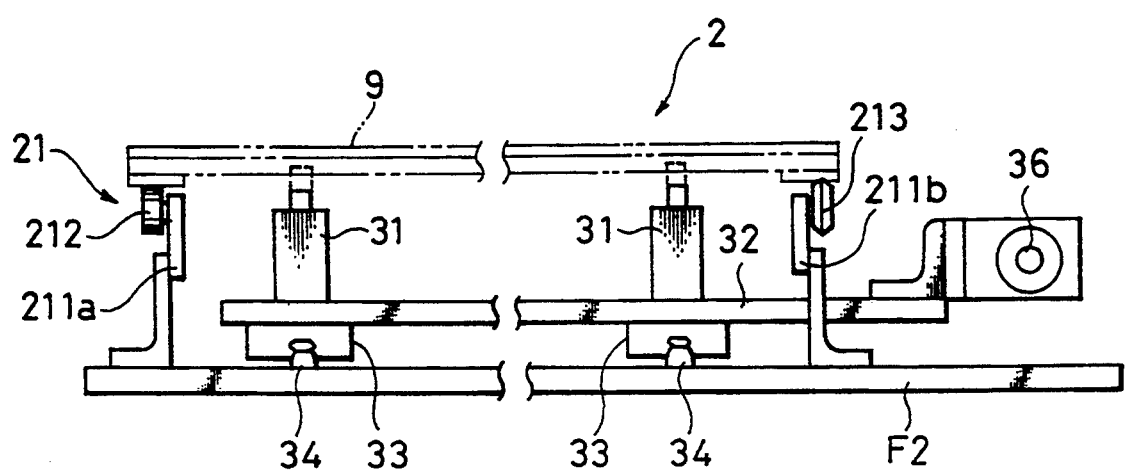
FIG. 7 is a view showing portions of the inlet station and the inlet pusher illustrated in FIG. 6 and seen from a downstream side of a test board in a feeding direction thereof.

As shown in FIGS. 6 and 7, a free roller conveyor 21 is disposed in the inlet station 2. FIG. 6 is a plan view showing the roller conveyor 21 and the inlet pusher 3 in the inlet station 2. FIG. 7 is a view showing the roller conveyor 21 and the inlet pusher 3 seen from a downstream side of the package tape in a feeding direction thereof or a board feeding direction α.

As shown in FIG. 7, the roller conveyor 21 has a pair of parallel conveyor frames 211a and 211b formed in the shape of a bar and supported by a package tester frame portion F2 of the package tester. A board guide roller 212 is rotatably attached to the conveyor frame 211a arranged on this side in FIG. 2. A board guide roller 213 is rotatably attached to the conveyor frame 211b arranged on a farther side in FIG. 2. The board guide rollers 212 and 213 are attached to the conveyor frames 211a and 211b in a state in which these board guide rollers 212 and 213 are respectively spaced from the conveyor frames 211a and 211b at predetermined distances. The board guide roller 212 is constructed by a roller having a flat circumferential face. The board guide roller 213 is constructed by a roller formed in a V-shape in cross section such that a central portion of this roller is raised.

As explained in detail later, a flat member 911 having a flat lower face is disposed on a lower face of an end portion of a test board 9 shown in FIG. 15 and arranged on an underside of the test board 9. The flat member 911 is supported by the board guide roller 212. Further, the board guide roller 213 is fitted into a V-shaped groove 912a of a constructional member 912 disposed on a lower face of an end portion of the test board 9 on an opposing a deeper side thereof. Thus, the test board 9 can be arranged and moved on the roller conveyor 21 in a state in which the test board 9 is positioned to extend across the feeding direction α.

In this embodiment, the test board 9 is positioned as mentioned above with respect to feeding direction α. However, the test board 9 may also be otherwise positioned. Namely, alternating, the board guide roller 213 is constructed by a flat roller such as the board guide roller 212 and a free roller arranged in a constant position comes in contact with an opposing end face of the test board 9 from a side thereof. Further, a free roller biased by the resilient force of a spring comes in contact with an end face of the test board 9 on this side thereof. The test board 9 may be similarly positioned with respect to a testing area conveyor 10, etc. explained later.

As shown in FIGS. 6 and 7, the inlet pusher 3 has a pair of air cylinders 31 arranged between the conveyor frames 211a and 211b of the above roller conveyor 21. The inlet pusher 3 also has a cylinder supporting plate 32 for vertically supporting these air cylinders 31, and a pair of sliders 33 fixed onto a lower face of the cylinder supporting plate 32 The inlet pusher 3 also has rails 34 formed on the tester frame F2 such that the sliders 33 can be slidably reciprocated in the feeding direction α of the test board 9.

The inlet pusher 3 also has a female screw portion 35 fixed to an end portion of the cylinder supporting plate 32 The inlet pusher 3 also has a screw bar 36 screwed into the female screw portion 35 and extending in the feeding direction α of the test board 9. The inlet pusher 3 further has a servo motor 37 for rotating the screw bar 36 in normal and reverse directions. The servo motor 37 can be rotated by a pulse signal for controlling a degree of rotation of the screw bar 36.

In accordance with inlet pusher 3, the cylinder supporting plate 32 is first arranged in a retracting position shown by a two-dotted chain line in FIG. 6. Accordingly, the pair of air cylinders 31 is also arranged in retracting positions and a piston rod 31a of each of the air cylinders 31 is lowered, thereby attaining a standby state of the inlet pusher 3. In this state, a package tape PT is mounted onto the test board 9 (arranged above the air cylinders 31) and supported by the roller conveyor 21. When the package tape PT is completely mounted onto the test board 9, the piston rod 31 of each of the air cylinders 31 is raised to start and rotate the servo motor 37 in the normal direction.

Thus, the screw bar 36 is rotated in the normal direction so that the female screw portion 35, the cylinder supporting plate 32 and the air cylinders 31 begin to be moved forward together. The piston rod 31a is engaged with the test board 9 by this forward movement so that the test board 9 is pushed on the roller conveyor 10 into testing area TA. A pushing distance W of the test board 9 at one time is set to a distance corresponding to an entire width W of the test board 9 in the feeding direction α thereof.

After the air cylinders 31 push the test board 9 by the pushing distance W thereof, tile piston rod 31a is lowered and the servo motor 37 begins to be rotated in the reverse direction. Thus, an operating position of each of the air cylinders 31 i;s returned to an initial position thereof to prepare a pushing operation of the next test board 9. When a package begins to be tested in the testing area TA, the operation of each of the air cylinders 31 is stopped in a complete pushing position of the test board 9 until the package is completely tested. This is because the test board 9 in the testing area TA is set to come in close contact with the reaction force pusher 5 described later during the package test in a predetermined position corresponding to a contact device E.

The engaging relation between the test board 9 and the piston rod 31a of each of the air cylinders 31 will be described further in detail in the next explanation of the test board 9.

The test board 9 will now be described.

Figure 16:
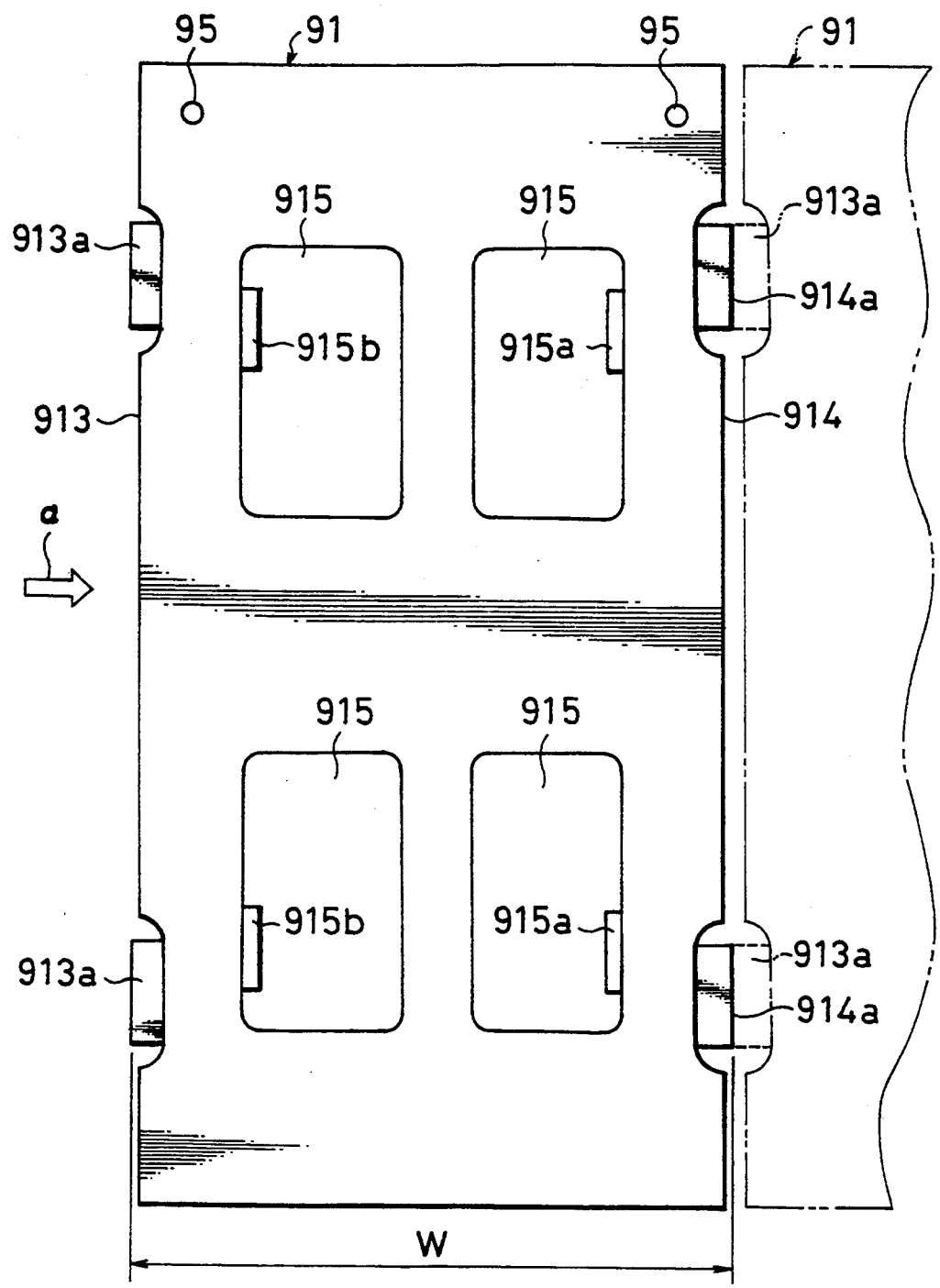
FIG. 16 is a plan view of a basic pallet in the test board.

The test board 9 is provided as shown in FIGS. 15a and 15b. FIGS. 15a and 15b are respectively plan and side views of the test board 9. FIG. 16 is a plan view of a basic pallet 91 constituting the test board 9.

In this test board 9, a printed wiring substrate 92 having printed wirings is fixed onto an upper face of the basic pallet 91 and package sockets 93 are electrically connected and fixed onto the printed wiring substrate 92. In this embodiment, the package sockets 93 are disposed in four lines in the feeding direction α of the test board 9 in accordance with four lines of package tapes PT drawn out of the tape supplying device 1. Five package sockets 93 are arranged on each of the four package socket lines.

Similar to the socket S shown in FIG. 1, each of the package sockets 93 has an electrode which comes in contact with an electrode of a package TCP on a package tape PT. Each of the package sockets 93 also has a socket body 931 having a positioning pin for fitting the package tape PT into a lug hole, etc. Each of the package sockets 93 also has a socket cover 932 which is connected to the socket body 931 by a hinge and can be opened and closed. Each of the package sockets 93 further has a latch 933 connected to the socket body 931 by a hinge and locking the socket cover 932 in a closing position in which the socket cover 932 covers the socket body 931.

The resilient force of a spring 934 is applied to the socket cover 932 at any time in an opening direction thereof. Accordingly, when the latch 933 is unlocked or disengaged, the socket cover 932 is automatically moved and located in an opening position by the resilient force of the spring 934. FIG. 15b shows an opening state of the socket cover 932 with respect to one socket. The resilient force of a spring 935 is applied to the latch 933 toward a locking position thereof at any time. Accordingly, the socket cover 932 can be opened when the latch 933 is rotated and moved toward an unlocking position thereof against the resilient force of the spring 935.

As shown in FIG. 15a, an end face 933a of the latch 933 on a side of the socket cover 932 is formed in the shape of an arc seen from above. The reasons for this arc shape will be described in an explanation of the tape receiver 7. FIG. 15a shows a mounting state of the package tape PT. In FIG. 15a, a supporting portion of the package tape PT supported by the socket body 931 is shown by a solid line to clarify the supporting portion although this supporting portion should be shown by a broken line.

A connector connecting portion 94 is disposed in a farther end portion of the printed wiring substrate 92 having printed wirings. A flat card connector e2 in the contact device E in the testing area TA is inserted into this connector connecting portion 94 so that the connector connecting portion 94 is electrically connected to the contact device E.

Further, unillustrated positioning pins are lowered together with the card connector e2 when the card connector e2 of the contact device E is lowered and inserted into the connector connecting portion 94. These positioning pins are respectively fitted into pin holes 95 formed along the printed wiring substrate 92 and the basic pallet As shown in FIG. 16, the basic pallet 91 has a pair of contact members 913a on an upstream side face 913 of the test board 9 in the feeding direction α thereof. The basic pallet 91 also has contact members 914a on a downstream side face 914 of the test board 9 in the feeding direction α thereof. Positions of the contact members 914a are symmetrical with respect to positions of the contact members 913a. Outside faces of these contact members 913a and 914a are respectively located outside the side faces 913 and 914 of the basic pallet 91.

Each of the contact members 913a and 914a is formed by a hard material such as stainless steel. When test boards 9 are sequentially pushed by the inlet pusher 3, the contact members prevent bodies of basic pallets 91 and printed wiring substrates 92 on the basic pallets 91 from respectively coming in direct contact with each other and being deformed with respect to the adjacent test boards 9. As shown in FIG. 16, these contact members 913a and 914a come in contact with each other with respect to the adjacent test boards 9.

Four rectangular holes 915 for reducing the weight of a basic pallet 91 are symmetrically formed in the basic pallet 91. A contact member 915a is made of stainless steel and is disposed on an inner face of a rectangular hole 915 on a downstream side thereof in the feeding direction α of a test board 9. Similarly, a contact member 915b is disposed on an inner face of a rectangular hole 915 on an upstream side thereof in the feeding direction α.

The piston rod 31a of each of the air cylinders 31 in the inlet pusher 3 is raised when the test board 9 is pushed out. At this time, the piston rod 31a is fitted into the downstream hole 915 and comes in contact with the contact member 915a so that the test board 9 is pushed out. The contact member 915b is disposed in the upstream hole 915 to fit a piston rod 51a of an air cylinder 51 described later in the reaction force pusher 5 into the upstream hole 915 and make the piston rod 51a come in contact with the contact member 915b.

In the basic pallet 91, a flat member 911 having a lower flat face is disposed along a lower end portion of the basic pallet 91 on this side thereof in FIG. 15b. Further, a constructional member 912 is disposed along an end portion of the basic pallet 91 on a deeper side thereof. A groove 912a having a V-shape in cross section is disposed on a lower face of the constructional member 912 in the feeding direction α of the test board 9.

When the test board 9 is moved onto the roller conveyor 21 of the inlet station 2, the roller conveyor 10 in the testing area TA and a roller conveyor 41 of the outlet station 4 described later, the flat member 911 on this side of the basic pallet 91 is arranged on the board guide roller 212 having a flat circumferential face in each of the roller conveyors 21, 10 and 41. The intermediate guide roller 213 located on a far side of each of the roller conveyors 21, 10 and 41 is engaged with the groove 912a of the constructional member 912 on the far side of the basic pallet 91. The test board 9 moved by these roller conveyors 21, 10 and 41 extends in a direction crossing the board feeding direction α and is determined by engagement of the guide roller 213 with the V-shaped groove 912a.

The size of the test board 9 is determined as follows.

For example, when the TCP is constructed by an integrated circuit device, a longitudinal size of the package tape PT with respect to one package is generally set to a multiple of the pitch (typically set to 4.75 mm) of lug holes of the package tape PT. The number of lug holes per one package having a large size is large. In contrast to this, the number of lug holes per one package having a small size is small. Each of contact devices E in the testing area TA is arranged in a constant position. Accordingly, when no length or width of the test board 9 in the feeding direction α thereof is determined in consideration of such a situation, no positions of the contact devices E correspond to the test board 9 when the number of lug holes with respect to one package is changed by a change in kind of the test board 9. Accordingly, the contact devices E must be changed in this case.

Therefore, for example, (as described above) pitch of the lug holes is typically set to 4.75 mm and a reference size of the test board 9 in the feeding direction α thereof is set to 285 mm, the present invention can be applied to about 60% of integrated circuit devices (each having 3 to 12 lug holes sold at present in the commercial market with respect to one package without changing the contact devices E. In this embodiment, 285 mm is used as the reference size of the test board 9 in the feeding direction. When an entire width W of the test board 9 is set to 285 mm, no package tape PT can be mounted between adjacent test boards 9 especially when a length of the package tape PT is reduced by dispersion in size thereof. In this case, the entire width W of the test board 9 is set to a width slightly narrower than 285 mm.

More particularly, entire width W of the test board 9 from the contact member 913a to the contact member 914a is set to 284.8 mm in conformity with a size of the package tape PT, thereby providing a minimum dispersion in size thereof. Lengths of the basic pallet 91, the printed wiring substrate 92 and each of the lines of the package sockets 93 are respectively set to 284 mm. Thus, the package tape PT can be mounted onto adjacent test boards 9 without damaging the lug holes.

The testing area TA, the roller conveyor 10 and the contact devices E will next be described.

The roller conveyor 10 is arranged in the testing area TA. This roller conveyor 10 is formed by extending the roller conveyor 21 in the above inlet station 2 as it is. Accordingly, the roller conveyor 10 substantially has the same structure as the roller conveyor 21.

A plurality of contact devices E are arranged above roller conveyor 10 along a longitudinal direction thereof. Each of the contact devices E has an air cylinder e1 for raising and lowering the card connector e2. Each of the contact devices E is pushed out by the entire width W of the test board 9 by using the inlet pusher 3 from the inlet station 2. The contact devices E are arranged such that each of the contact devices E corresponds to each of plural test boards 9 coming in contact with each other and closely arranged on the roller conveyor 10.

Accordingly, when packages begin to be tested, the card connector e2 is lowered by operating the air cylinder e1 in each of the contact devices E and can be connected to the connector connecting portion 94 in a corresponding test board 9. All card connectors e2 can be simultaneously raised after the packages are completely tested. Thus, a large amount of packages can be tested at one time. Only two contact devices E are shown in FIG. 2, but three or more contact devices E can be arranged in as needed.

The testing area TA is surrounded by a constant temperature oven 100 having an inlet 101 and an outlet 102 for the test board 9. This testing area TA can be maintained at a predetermined temperature for the package test.

The outlet station 4, the reaction force pusher 5 and the braking device 8 will next be described.

Figure 8A:
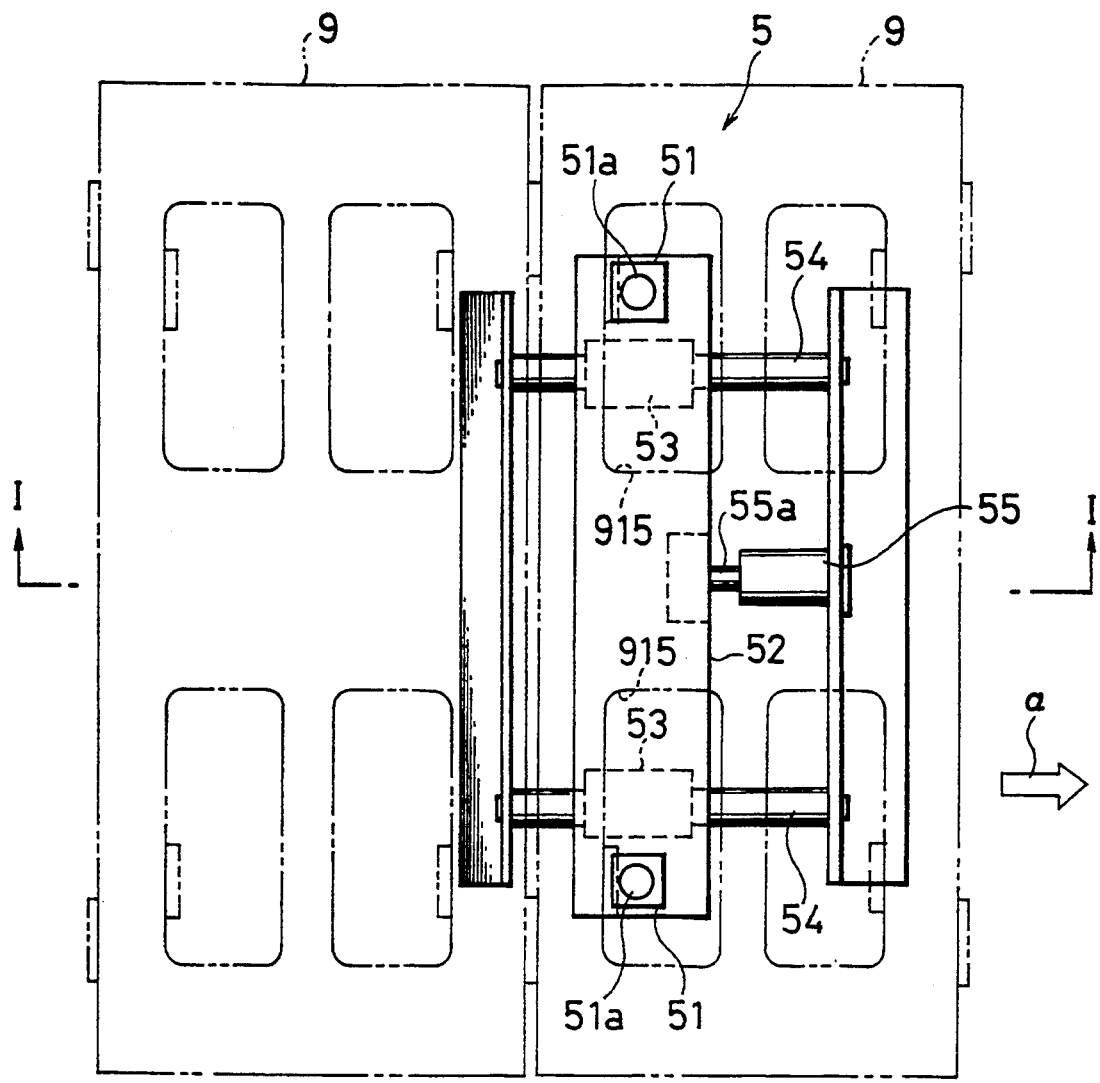
FIG. 8a is a plan view showing a reaction force pusher in an outlet station.
Figure 8B:
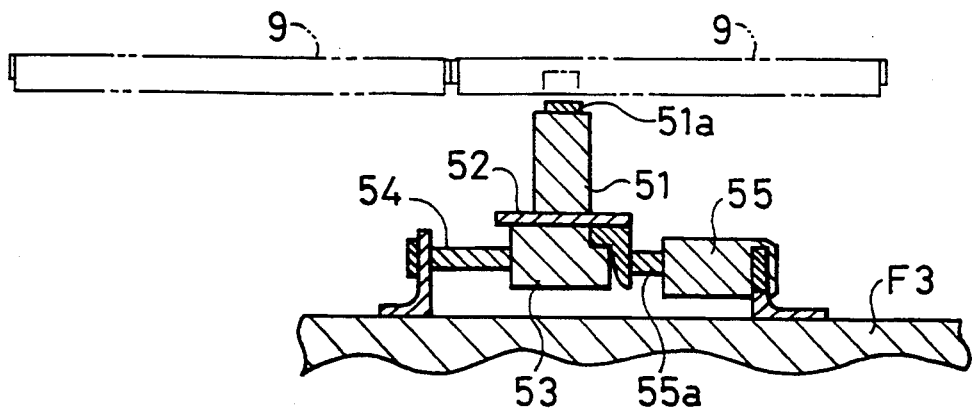
Figure 9:
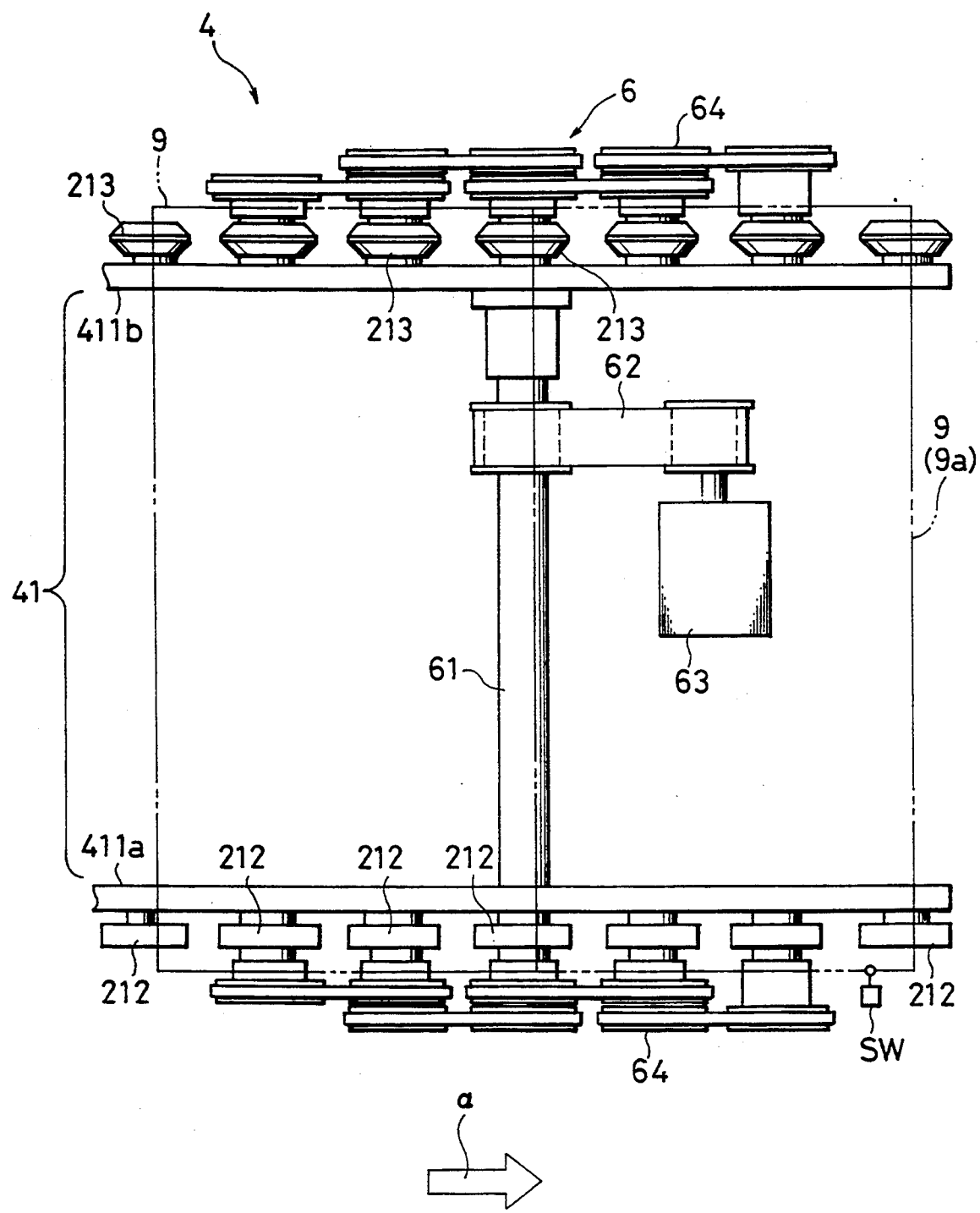
FIG. 9 is a plan view showing the outlet station and a braking device disposed in the outlet station.

As shown in FIG. 9, the outlet station 4 has a roller conveyor 41. The roller conveyor 41 substantially has the same basic construction as the roller conveyor 10 in the testing area TA and is adjacent to the roller conveyor 10. Namely, the roller conveyor 41 has a pair of parallel conveyor frames 411a and 411b formed in the shape of a bar and supported by a frame F3 of the package tester (see FIG. 8). The board guide rollers 212 are spaced from each other at a predetermined distance in the conveyor frame 411a on this side of the roller conveyor 41. The board guide rollers 213 are spaced from each other at a predetermined distance in the conveyor frame 411b on a far side of the roller conveyor 41.

Each of the board guide rollers 212 is comparable to each of the board guide rollers 212 of the roller conveyor 21 in the inlet station 2. Each of the board guide rollers 213 on the far side of the roller conveyor 41 is comparable to each of the board guide rollers 213 in the roller conveyor 21. These board guide rollers 212 and 213 are respectively rotatably attached to the conveyor frames 411a and 411b. A portion of the braking device 6 is constructed by intermediate board guide rollers 212, 213 of the above board guide rollers 212, 213 except for uppermost board guide rollers 212, 213 on an uppermost stream side of the test board 9 and lowermost board guide rollers 212, 213 on a lowermost stream side of the test board 9 in the feeding direction α.

The braking device 6 supports central board guide rollers 212 and 213 in both end portions of a shaft 61 rotatably disposed between the conveyor frames 411a and 411b. This shaft 61 can be rotated by a motor 63 through a transmission device 62. Driving force of the shaft 61 is transmitted to the other board guide rollers 212 and 213 through transmission devices 64. Thus, each of the four intermediate board guide rollers 212 and 213 can be rotated in the feeding direction α of the test board 9.

A circumferential speed of each of the board guide rollers 212 and 213 rotated by the motor 63 is equal to a feeding speed of the test board 9 and is equal to or slower than a pushing-out speed of the test board 9 in the inlet pusher 3. Accordingly, the test board 9 pushed onto this braking device 6 comes in contact with the board guide rollers 212 and 213 forming this braking device 6. Thus, it is possible to prevent the test board 9 from being unlimitedly moved by inertial force thereof since frictional forces of the board guide rollers 212 and 213 are applied to the test board 9 even when the test board 9 begins to be moved by the inertial force at a speed higher than the circumferential speed of each of the board guide rollers 212 and 213. Accordingly, test boards 9 prior to the braking device 6 are maintained in an arranging state in which these test boards 9 come in close contact with each other.

As shown in FIG. 8, the reaction force pusher 5 is arranged between the pair of conveyor frames 411a and 411b of the above roller conveyor 41. This reaction force pusher 5 has a pair of air cylinders 51, a cylinder supporting plate 52 for vertically supporting these air cylinders 51, and a pair of sliders 53 fixed onto lower faces of the cylinder supporting plate 52. The reaction force pusher 5 further has a pair of guide rods 54 engaged with the sliders 53 and an air cylinder 55 for moving the cylinder supporting plate 52. The pair of guide rods 54 extends in parallel with each other along the feeding direction α of the test board 9 and is fixedly supported by the tester frame F3 thereon. The air cylinder 55 is also supported by the package tester frame F3 and a piston rod 55a of this air cylinder 55 is connected to the cylinder supporting plate 52.

In this reaction force pusher 5, before the test board 9 is pushed toward the testing area TA, the piston rod 55a of the air cylinder 55 is projected in a direction opposite to the feeding direction α of the test board 9 in a state in which the piston rod 51a in each of the pair of air cylinders 51 is lowered. Thus, the pair of air cylinders 51 is also moved in this opposite direction. In this state, the package tester is waiting for the test board 9 to finish package test and be pushed out of the testing area TA in accordance with the pushing-out operation of the test board 9 using the inlet pusher 3.

The test board 9 (pushed out of the testing area TA) is first received by the roller conveyor 41 shown in FIG. 9 and comes in contact with the board guide rollers 212 and 213 of the braking device 6. A free forward movement of the test board 9 is prevented by frictional force between the test board 9 and the board guide rollers 212 and 213. Thus, adjacent test boards 9 in a test board group continued from the testing area TA are maintained in a state in which the adjacent test boards 9 come in contact with each other. When test boards 9 (completed with respect to the package test) are pushed to a certain extent from the testing area TA, the piston rod 51a of each of the pair of air cylinders 51 in the reaction force pusher 5 is projected upward. Thus, the piston rod 51a is fitted into the upstream hole 915 disposed in the basic pallet 91 of a test board 9 on an upstream side thereof in the feeding direction α.

When the test board 9 is further pushed out, the piston rod 51a comes in contact with the contact member 915b shown in FIG. 16 and disposed on an inner face of the upstream hole 915 on an upstream side thereof. However, the pushing-out force of the test board 9 provided by the inlet pusher 3 is set to be stronger than supporting reaction force of the air cylinder 55 in the reaction force pusher 5. Accordingly, the piston rod 51a is moved backward in the feeding direction α of the test board 9 in a state in which the piston rod 51a comes in contact with the contact member 915b. The movement of the piston rod 51a is stopped when the test board 9 is completely pushed out by the inlet pusher 3.

In this state, test boards 9 within the testing area TA are pushed by the inlet pusher 3 on an inlet side of the testing area TA and are supported by the reaction force pusher 5 on an outlet side of the testing area TA. Thus, the adjacent test boards 9 accurately come in contact with each other so that positions of the respective test boards 9 with respect to the contact devices E are exactly determined in the testing area TA.

When the package test is thus completed, the piston rod 51a of each of the pair of air cylinders 51 in the reaction force pusher 5 is lowered and a position of each of the air cylinders 51 is again returned to a standby position for supporting the next test board 9 by an operation of the air cylinder 55.

The piston rod 51a of each of the air cylinders 51 is projected upward to engage the test board 9. For example, as shown in FIG. 9, upward projecting timing of this piston rod 51a is set to timing for detecting a test board 9 (9a) by a board detecting sensor SW just before this test board 9 (9a) is received by the elevator device 81 (shown in FIG. 2) of the board return device 8 in the outlet station 4. An unillustrated control section for controlling an operation of the entire package tester gives commands for projecting the piston rod 51a by detecting the test board 9 (9a) by the board detecting sensor SW.

The tape receiver 7 will next be described. The tape receiver 7 includes latch driving rollers 71 opposite to the outlet station 4 from above, the tape guide rollers (dancer rollers) 72 arranged on downstream sides of the latch driving rollers 71, and a reel supporting device 73 disposed above the tape guide rollers 72.

In FIG. 10, four latch driving rollers 71 and four tape guide rollers 72 are respectively disposed and correspond to four lines of package sockets 93 on one test board 9. Only one tape guide roller 72 constituting a pair together with a rightmost latch driving roller 71 is shown (the other tape guide rollers 72 are omitted) in FIG. 10. However, the other tape guide rollers 72 are similarly combined with the other latch driving rollers 71, respectively.

Figure 11A:
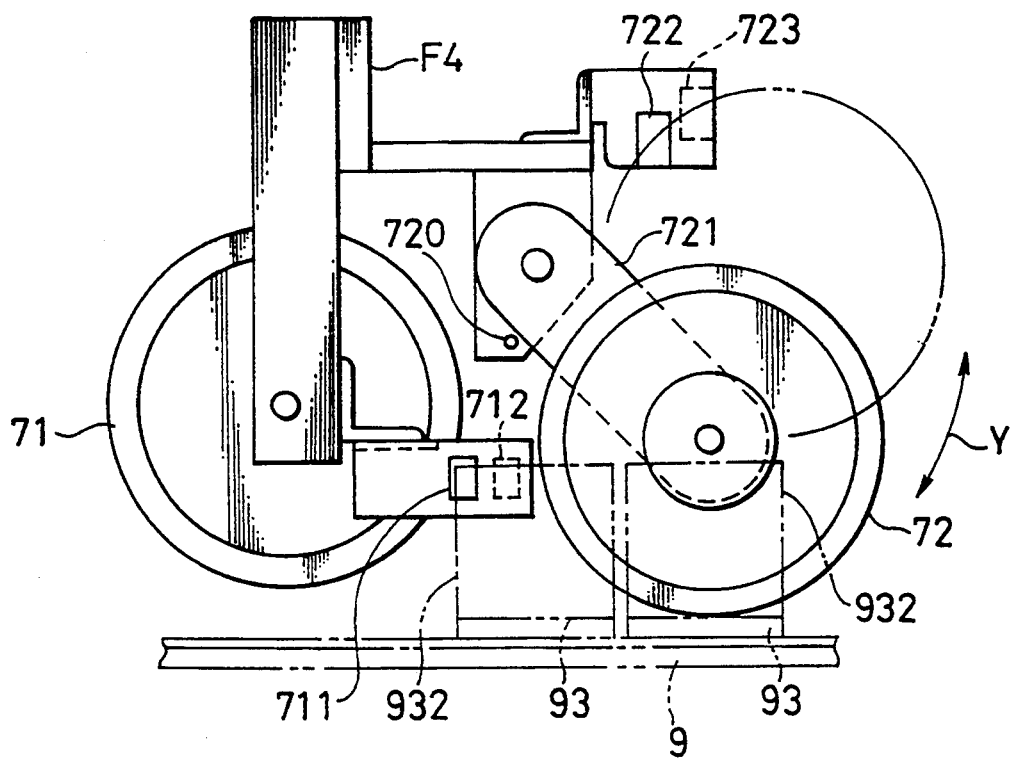
FIGS. 11a and 11b are respectively side and plan views showing a second latch driving roller from a right-hand side in FIG. 10 and a tape guide roller opposed as a pair to the second latch driving roller.
Figure 11B:
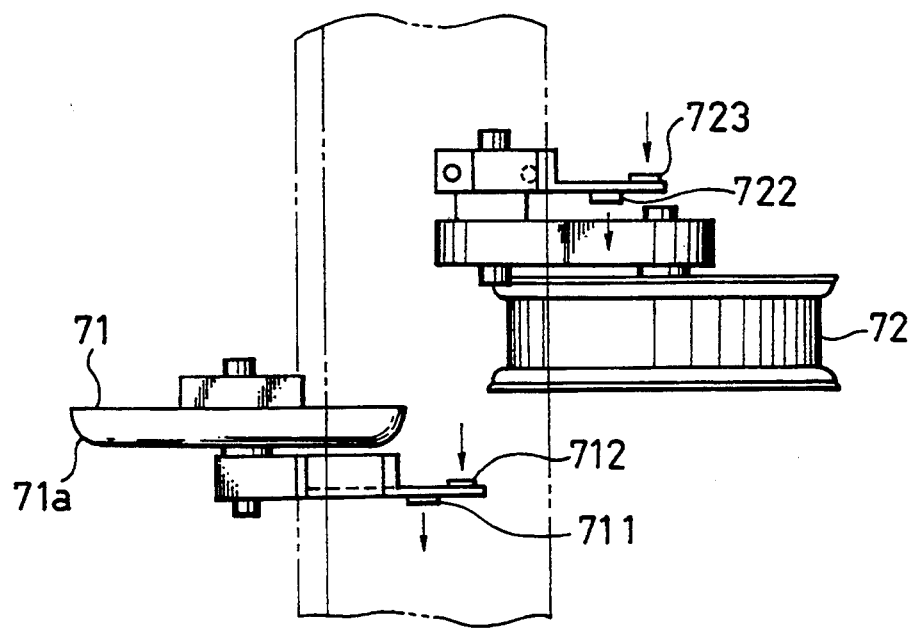

FIGS. 11a and 11b are respectively side and plan views showing a second latch driving roller 71 from a right-hand side in FIG. 10 and a tape guide roller 72 combined with this second latch driving roller 71.

The latch driving rollers 71 are rotatably supported by a package tester frame F4 disposed above the outlet station 4. Each of the latch driving rollers 71 is opposed to the orbit of a latch 933 in a package socket 93 on the test board 9 pushed out of the testing area TA. A circumferential edge portion 71a of each of the latch driving rollers 71 has an arc face formed such that this circumferential edge portion 71a begins to smoothly come in contact with the latch 933 and can then rotate and move this latch 933 to an unlocking position thereof. In contrast to this, the latch 933 also has an arc face 933a shown in FIG. 15 and formed such that the latch 933 begins to smoothly come in contact with each of the latch driving rollers 71 and is then pushed and moved to the unlocking position.

Accordingly, as shown in FIG. 9, the test board 9 pushed out of the testing area TA is fed to the latch driving rollers 71 by the roller conveyor 41 in the outlet station 4. When the test board 9 is further moved forward, the latch driving rollers 71 respectively come in contact with the latches 933 in the package sockets 93 on the package socket lines corresponding to the latch driving rollers 71. Each of the latches 933 is pushed and moved from a locking position to the unlocking position as the test board 9 is further moved forward. Thus, each of socket covers 932 is automatically raised by the resilient force of a spring 934 and is opened. Accordingly, the package tester attains a state in which a package tape PT can be pulled out of each of the package sockets 93. Thus, the lines of the package sockets 93 on the test board 9 pass through the respective latch driving rollers 71 so that each of the socket covers 932 on the lines of package sockets 93 is sequentially opened.

Optical switches 711 and 712 are respectively disposed on downstream sides of the latch driving rollers 71 to detect opening states of one set of socket covers 932. When each of the socket covers 932 is opened and raised, an optical path between the optical switches 711 and 712 for detecting the opening states of the socket covers 932 is interrupted. Thus, it is confirmed that each of the socket covers 932 is opened. When no opening state of each of the socket covers 932 is detected, the operations of all movable constructional portions in the continuous TCP tester are stopped on the basis of commands from an unillustrated control section for controlling an operation of the entire package tester.

Each of the tape guide rollers 72 is rotatably supported by a lower end portion of a swinging arm 721 stintingly attached to the above package tester frame F4. Each of the tape guide rollers 72 guides the package tape PT wound around a tape winding reel 73b of the reel supporting device 73 described later from a package socket 93 having an opened socket cover 932.

As shown by a two-dotted chain line in FIG. 11a, each of the tape guide rollers 72 is swung and raised when a rotational speed of the tape winding reel 73b is high so that a winding speed of the package tape PT is too high. Each of the tape guide rollers 72 is also swung and raised when winding tensile force of the package tape PT is increased because no package tape PT is separated from the package socket 93 so well. Thus, each of the tape guide rollers 72 interrupts an optical path about one set of optical switches 722 and 723 respectively opposed to the tape guide rollers 72 and detecting the tape guide rollers 72. An unillustrated control section gives commands for stopping a winding operation of the tape winding reel 73b by this interruption of the optical path.

Thus, the winding operation of the tape winding reel 73b is once stopped so that the package tape PT is slackened. When tensile force of the package tape PT is thus reduced, each of the tape guide rollers 72 is swung and lowered. Therefore, light is transmitted by the swinging and lowering movements of each of the tape guiding rollers 72 along the optical path of the optical switches 722 and 723 for detecting the tape guide rollers 72 so that the winding reel 73b is again rotated. Thus, the package tape PT is separated from the package socket 93 so that it is possible to prevent the package tape PT wound around the winding reel 73b from being damaged.

The swinging arm 721 comes in contact with a stopper 720 on the package tester frame F4 in a lowering position of the swinging arm 721 so that swinging arm 721 is not further lowered.

Figure 12A:
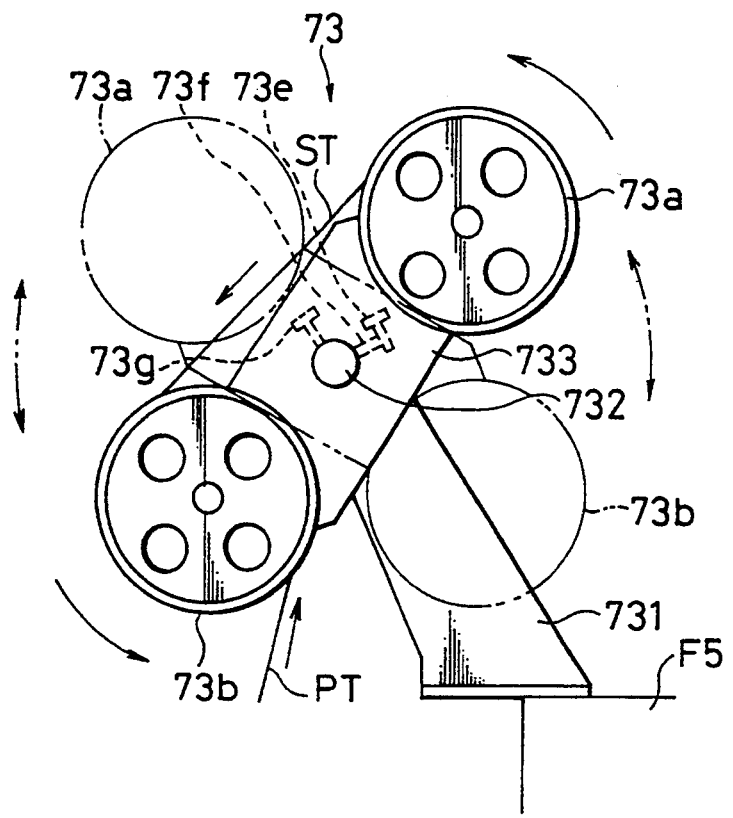
FIG. 12a is a side view showing a reel supporting device in a tape receiver.
Figure 12B:
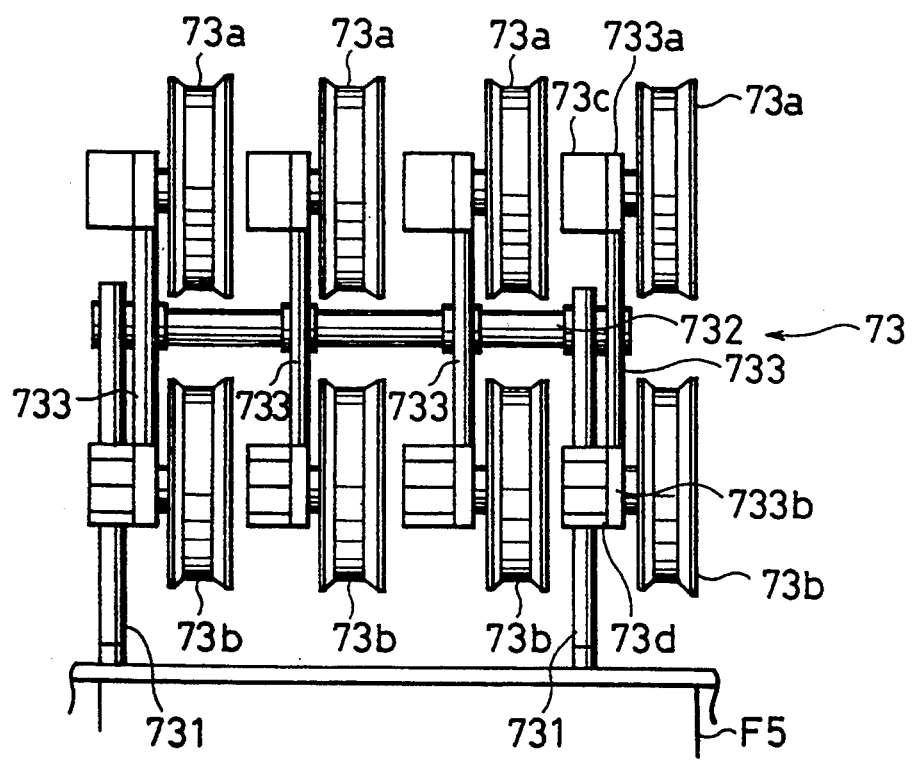

FIG. 12a is a side view of the reel supporting device FIG. 12b is a view of the reel supporting device 73 seen from a side of the testing area TA.

This reel supporting device 73 has a pair of pillars 731 vertically disposed in a package tester frame F5 and an arm shaft 732 horizontally attached between these pillars 731. The reel supporting device 73 also has four reel supporting arms 733 rotatably supported by the arm shaft 732 in parallel with each other and spaced from the arm shaft 732 at predetermined distances. A tape drawing-out reel 73a can be mounted to one end portion 733a of each of the reel supporting arms 733. A tape winding reel 73b can be mounted to another end portion 733b of each of the reel supporting arms 733. The mounted tape drawing-out reel 73a can be rotated by pulling a wound spacer tape ST out of this tape drawing-out reel 73a.

A braking device 73c using frictional resistance is disposed in the one end portion 733a of each of the reel supporting arms 733. The braking device 73c prevents the tape drawing-out reel 73a from being excessively rotated by inertial force caused in the pulling-out operation of the spacer tape ST. Further, a motor 73d is disposed in the another end portion 733b of each of the reel supporting arms 733 to rotate the mounted tape winding reel 73b in a winding direction. Each of the braking device 73c and the motor 73d may be constructed as a motor having a braking function.

Each of the reel supporting arms 733 can be independently rotated around the arm shaft 732 and moved to a reel detaching or exchanging position (shown by a two-dotted chain line in FIG. 12a). Further, each of the reel supporting arms 733 can be independently rotated and returned from the reel detaching or exchanging position to a normal operating position. As shown by broken lines in FIG. 12a, a projection 73e is disposed on one face of each of the reel supporting arms 733 and stoppers 73f, 73g are disposed in the arm shaft 732 such that these stoppers 73f, 73g are opposed to an orbit of this projection 73e. The projection 73e and the stoppers 73f, 73g are omitted in FIG. 12b. The projection 73e comes in contact with the stopper 73f in the normal operating position and comes in contact with the stopper 73g in the reel detaching or exchanging position. The stopper means is not limited to the illustrated structure of stoppers 73f and 73g.

Each of the reel supporting arms 733 is manually rotated. Accordingly, a position for supporting each of the reel supporting arms 733 by the arm shaft 732 is selectively determined in consideration of weights of the arms, the reels, the tape, etc. such that each of the reel supporting arms 733 is simply and easily rotated with reduced labor and improved balance.

In accordance with reel supporting device 73, the tape drawing-out reel 73a mounted to the one end portion 733a of each of the reel supporting arms 733 is provided by winding the continuous elongated spacer tape ST therearound in advance. As shown in FIG. 12a, a package tape PT having a tested package from a package socket 93 on a test board 9 is wound around the tape winding reel 73b. The spacer tape ST from the tape drawing-out reel 73a is also wound around the tape winding reel 73b together with the package tape PT in a state in which the spacer tape ST overlaps with the package tape PT.

The board return device 8 will next be described.

Figure 13:
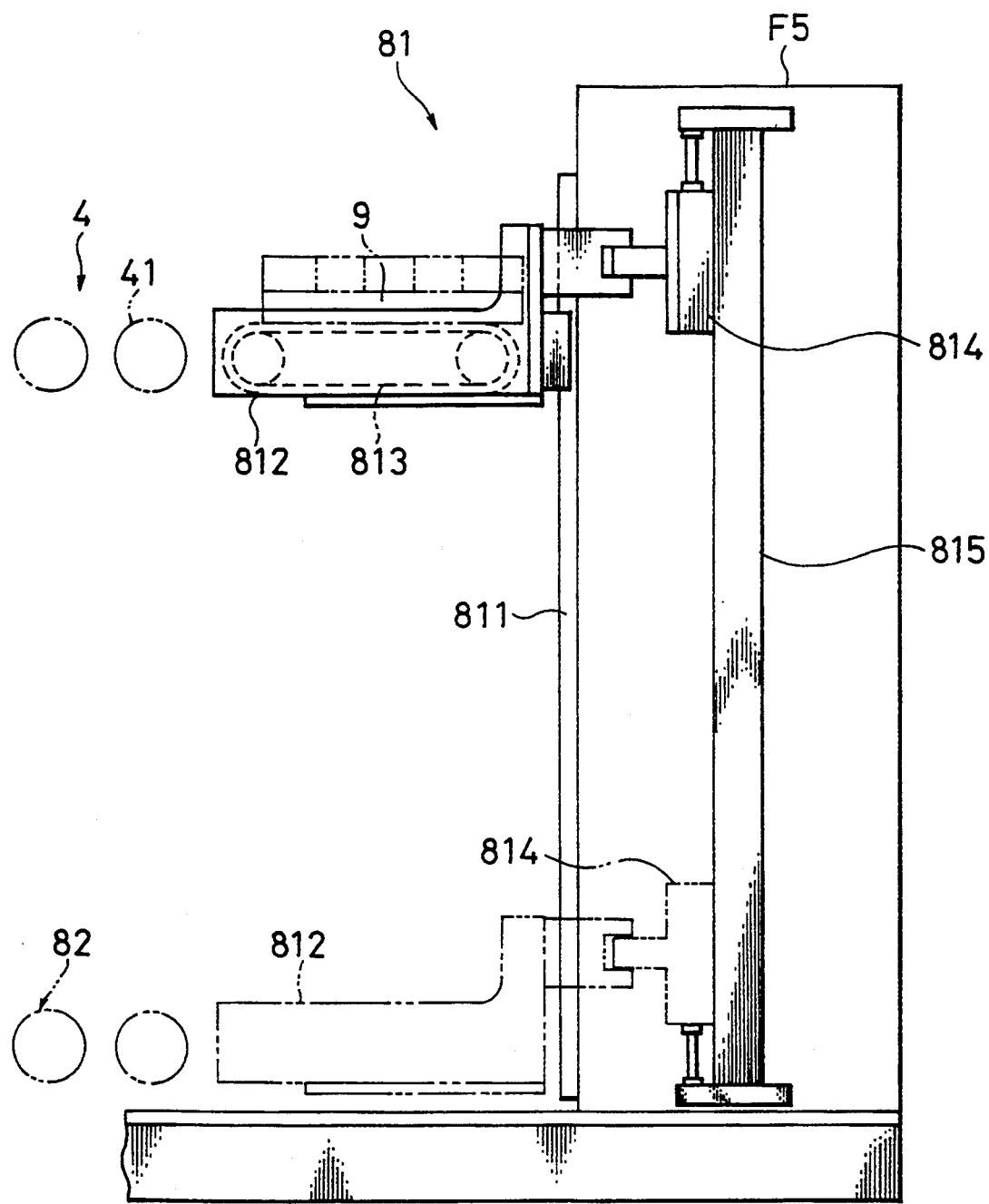
FIG. 13 is a side view of an elevator device on an output station side forming the board return device.

As shown in FIG. 2, the board return device 8 has an elevator device 81 opposite to the outlet station 4, an elevator device 83 opposite to the inlet station 2, and a return conveyor 82 for communicating the elevator devices 81 and 83 with each other (see FIG. 13).

Figure 14:
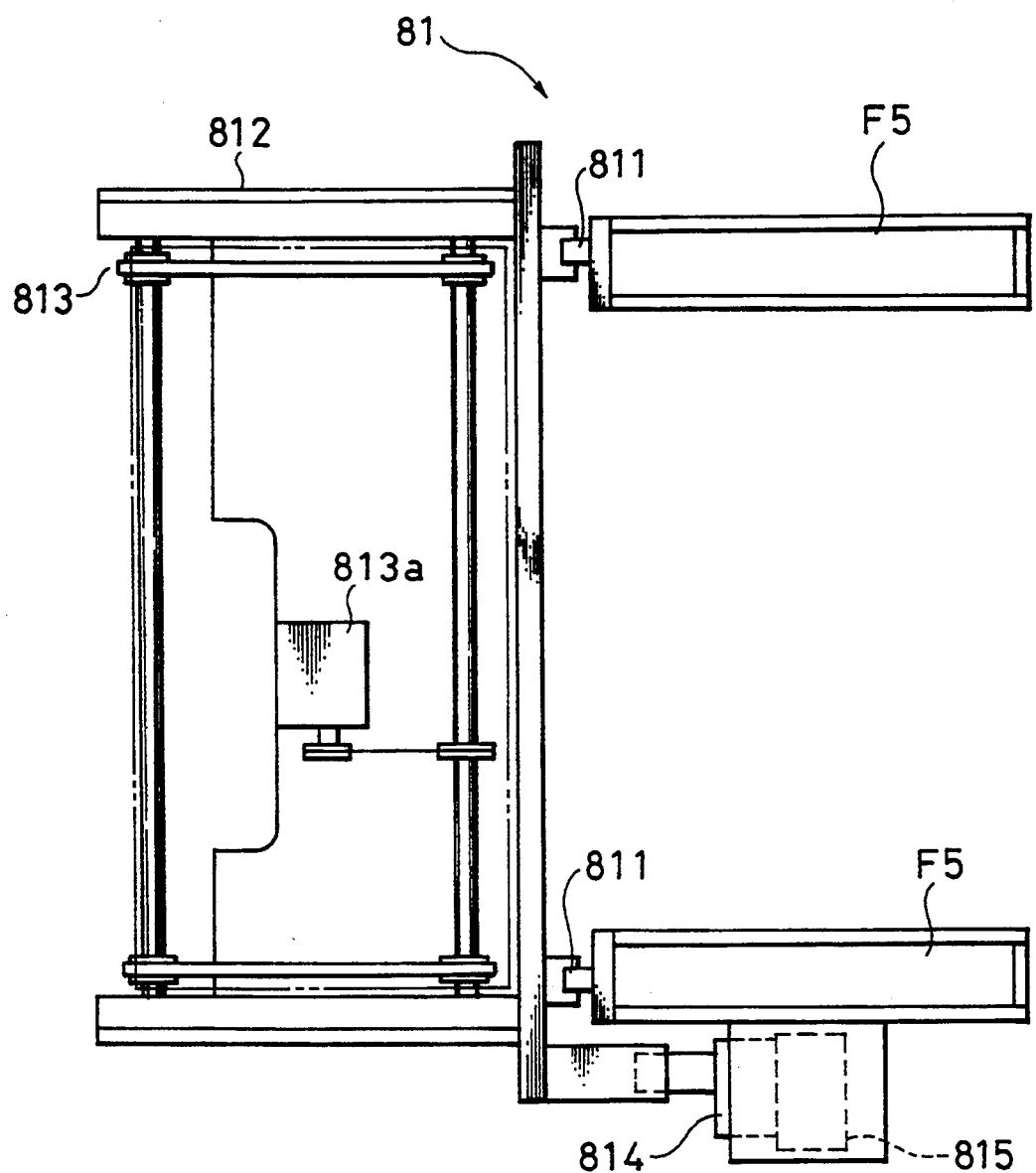
FIG. 14 is a plan view of the elevator device shown in FIG. 13.

FIGS. 13 and 14 are respectively side and plan views of the elevator device 81. As shown in FIGS. 13 and 14, the elevator device 81 has an elevator 812 elevated along a pair of guide members 811 which extends in a vertical direction and is disposed on one face of the package tester frame F5 at one end of the package tester. The elevator device 81 also has a driving member 814 engaged with this elevator 812, and an air cylinder 815 for raising and lowering the driving member 814. The elevator 812 has a belt conveyor 813 rotated by a motor 813a in normal and reverse directions.

In accordance with elevator device 81, the elevator 812 can be moved and opposed to an outlet end of the roller conveyor 41 in the outlet station 4 by locating the driving member 814 in an upper limit position thereof by the air cylinder 815. In this state, an empty test board 9 having an opened socket cover 932 on the roller conveyor 41 in the outlet station 4 is received onto the elevator 812 by rotating the belt conveyor 813 on the elevator 812 in the normal direction. Thereafter, the driving member 814 is lowered by the air cylinder 815 so that the elevator 812 can be lowered to a lower limit position opposite to the return conveyor 82.

In this lower limit position, the belt conveyor 813 on the elevator 812 is rotated in the reverse direction so that the test board 9 on the belt conveyor 813 can be transmitted onto the return conveyor 82. After the test board 9 has been transmitted onto the return conveyor 82, the elevator 812 is again raised to a position opposite to the outlet station 4.

The return conveyor 82 substantially has the same structure as the roller conveyor 10 in the testing area TA except that each of rollers of this return conveyor 82 is rotated by a motor through an unillustrated transmission device. Namely, the return conveyor 82 has a pair of conveyor frames parallel to the feeding direction α of the test board 9. An intermediate board guide roller 213 is disposed in one of the conveyor frames arranged on a deeper side of the return conveyor 82. A board guide roller 212 having a flat circumferential face is disposed in the other conveyor frame arranged on this side of the return conveyor 82.

This return conveyor 82 conveys the test board 9 received from the elevator device 81 to the elevator device 83 opposite the inlet station 2.

As illustrated in FIGS. 4 and 5 showing the elevator device 83 and the tape guiding section 12, the elevator device 83 has an elevator 832 elevated along a pair of guide members 831 which extends in a vertical direction and is disposed on one face of the package tester frame F1. The elevator device 83 also has a driving member 834 engaged with this elevator 832, and an air cylinder 835 for raising and lowering the driving member 834. The elevator 832 has a belt conveyor 833 rotated by a motor 833a in normal and reverse directions.

In accordance with this elevator device 83, the driving member 834 is lowered to a lower limit position thereof by the air cylinder 835. Accordingly, the elevator 832 is arranged in a position opposite to an outlet of the return conveyor 82. In this position, a test board 9 conveyed from the return conveyor 82 is received onto the elevator 832 by rotating the belt conveyor 833 in the reverse direction. Thereafter, the driving member 834 is raised by operating the air cylinder 835 so that the elevator 832 is arranged in an upper limit position opposite to the roller conveyor 21 in the inlet station 2. In this state, the belt conveyor 833 is rotated in the normal direction. Thus, the test board 9 on the belt conveyor 833 is conveyed onto the inlet station 2 in a state in which a socket cover 932 of this test board 9 is opened. The test board 9 then waits for a package tape PT mounted thereon in the inlet station 2.

For example, the above continuous TCP tester tests IC packages sequentially formed on the package tape PT as a continuous elongated tape as follows. This package tape PT and a spacer tape ST stacked thereon are wound around the tape drawing-out reel 11a together. This tape drawing-out reel 11a is mounted to each of the reel supporting arms 113 of the reel supporting device 11 in the tape supplying device 1. The tape winding reel 11b is also mounted to each of the reel supporting arms 113.

Further, the spacer tape ST is wound around the tape drawing-out reel 73a in advance and this tape drawing-out reel 73a is mounted to each of the reel supporting arms 733 of the reel supporting device 73 in the tape receiver 7. The tape winding reel 73b is also mounted to each of the reel supporting arms 733.

The package tape PT is pulled out of each of the tape drawing-out reels 11a in the tape supplying device 1 and is sequentially guided to the tape guide roller 121, the dancer roller 122 and the tape guide roller 123 in the tape guiding section 12. The package tape PT is then pulled out to the tape guide plate 124. Thus, the package tester attains a standby state for mounting the package tape PT onto a package socket 93.

The spacer tape ST simultaneously pulled out of the tape drawing-out reel 11a is connected to the tape winding reel 11b and is sequentially wound around the tape winding reel 11b by a winding operation thereof. The tape receiver 7 pulls the spacer tape ST out of each of the tape drawing-out reels 73a in the reel supporting device 73. The tape receiver 7 then connects this spacer tape ST to each of the tape winding reels 73b in advance such that this spacer tape ST is wound around a tape winding reel 73b together with the package tape PT when the package tape PT is wound around the tape winding reel 73b.

Further, adjacent test boards g are arranged in a state in which the adjacent test boards g come in close contact with each other alone the inlet station 2, the roller conveyor 10 in the testing area TA and the outlet station 4. The testing area TA is maintained at a predetermined temperature for the package test by operating the constant temperature oven 100.

When the above conditions for the package test are completely prepared, four lines of package tapes PT are pulled out of the tape guide plate 124 in the inlet station 2 and are mounted to the respective lines of package sockets 93 of the test boards 9 in the inlet station 2. Thereafter, the socket cover 932 of each of the package sockets 93 is closed and locked by the latch 933.

After each of the package tapes PT is thus completely mounted to one test board 9, the piston rod 31a of each of the pair of air cylinders 31 is raised in the inlet pusher 3 shown in detail in FIGS. 6 and 7. The piston rod 31a is then fitted into a hole 915 of the basic pallet 91 of the test board 9 mounting the package tape PT thereon. In this state, the servo motor 37 is rotated in a normal direction such that the piston rod 31a is moved in the feeding direction α of the test board 9. Thus, the piston rod 31a is engaged with the test board 9 so that the test board 9 is pushed onto the roller conveyor 10 in the testing area TA by a distance equal to a width W of the test board 9 in the feeding direction α.

When this test board 9 is pushed out, a test board 9 pushed out of the testing area TA comes in contact with the braking device 6 (shown in FIG. 9) in the outlet station 4. Thus, while inertial force of the test board 9 is braked by this braking device 6, the test board 9 is pushed out of the testing area TA in a state in which adjacent test boards 9 come in contact with each other.

When the test board 9 is pushed out of the testing area TA to a certain extent while the test board 9 is braked by the braking device 6, the board detecting sensor SW shown in FIG. 9 detects that the test board 9 reaches the board detecting sensor SW. At this time, the piston rod 51a of each of the pair of air cylinders 51 in the reaction force pusher 5 opposite to the outlet station 4 is raised, fitted and engaged with the hole 915 of the basic pallet 91 of the pushed test board 9. Before this movement of the piston rod 51a, the piston rod 55a of the air cylinder 55 in the reaction force pusher 5 is projected in advance in a direction opposite to the feeding direction α of the test board 9.

Thus, the piston rod 51a of the reaction force pusher 5 is engaged with the pushed test board 9 in the outlet station 4 as the test board 9 is pushed from the inlet station 2 to the testing area TA. Accordingly, the piston rod 51a is moved backward as the piston rod 51a supports the test board 9. Thus, the adjacent test boards 9 are reliably arranged and maintained in a state in which the adjacent test boards 9 come in contact with each other.

After the test board 9 is pushed from the inlet station 2 to the testing area TA by the width W of the test board 9 in the feeding direction α, the piston rod 31a is lowered in the inlet pusher 3 and the servo motor 37 is rotated in a reverse direction so that the piston rod 31a is moved backward until its original position. In the reaction force pusher 5, the piston rod 51a is lowered and the piston rod 55a is again projected to prepare a moving operation for the next commands.

In the inlet station 2, the next test board 9 mounting a package tape PT thereon begins to be pushed to the testing area TA by the inlet pusher 3 and the above-mentioned operations are repeatedly performed. Thus, a predetermined number of test boards 9 mounting package tapes PT thereon and corresponding to the number of contact devices E are arranged in the testing area TA in a state in which these test boards 9 come in contact with each other. The test boards 9 are respectively opposed to the corresponding contact devices E.

In this state, the air cylinder e1 in each of the contact devices E lowers a card connector e2 so that the card connector e2 is inserted into the connector connecting portion 94 on each of the test boards 9 to perform a predetermined package test.

As mentioned above, the test boards 9 are sequentially pushed into the testing area TA. Accordingly, an endmost test board 9 is sequentially moved outside the outlet station 4. This moved test board 9 is received by the elevator 812 of the elevator device 81 and is lowered. The test board 9 is then conveyed to the return conveyor 82 from the elevator 812 and is further conveyed to the elevator 832 of the elevator device 83 opposite to the inlet station 2 by operating the return conveyor 82.

The elevator 832 is raised after this elevator 832 has received this empty test board 9 (having no package tape). The elevator 832 then sends the empty test board 9 to the inlet station 2 so as to mount a package tape PT onto this empty test board 9. Thus, the test board 9 is again returned to the inlet station 2 from the outlet station 4 by an operation of the board return device 8 so that the movement of the test board 9 is circulated.

A predetermined number of test boards 9 having package tapes PT are arranged in the testing area TA. When the package test is started, the piston rod 31a remains engaged with the test boards 9 in the inlet pusher 3. In the reaction force pusher 5, the piston rod 51a remains engaged with the test boards 9. Thus, the test boards 9 within the testing area TA are supported on both sides thereof by the inlet pusher 3 and the reaction force pusher 5 and are maintained in a state in which these test boards 9 accurately come in contact with each other. The card connector e2 is reliably connected to each of the test boards 9 by each of the contact devices E.

When the package test is completed, the piston rod 31a is lowered in the inlet pusher 3 and is returned to its original position. In the reaction force pusher 5, the piston rod 51a is lowered and the piston rod 55a is projected to support the test boards 9. Thus, the test boards 9 having the package tapes PT are again sequentially pushed to the testing area TA to perform the next package test.

In this pushing-out operation of the test boards 9, test boards 9 having tested packages are sequentially pushed to the outlet station 4. In the outlet station 4, these test boards 9 are received by the latch driving rollers 71 arranged in accordance with the lines of package sockets 93 of the test boards 9. Each of the latch driving rollers 71 comes in contact with the latch 933 of each of the package sockets 93 on the test boards 9. The latch 933 is pushed by each of the latch driving rollers 71 as the test boards 9 are pushed out. Therefore, the latch 933 is rotated and moved to the unlocking position thereof.

Thus, the socket cover 932 of each of the package sockets 93 is automatically opened by the resilient force of a spring 934 and attains a state in which a package tape PT can be pulled out of the socket cover 932. After the package test is completed, a first pulled package tape PT on each of the test boards 9 is connected to the tape winding reel 73b in the reel supporting device 73 after the socket cover 932 is opened. At this time, the wound package tape PT is guided to the tape guide roller 72.

Thus, the latch 933 of each of the package sockets 93 on the test boards 9 is displaced to the unlocking position thereof as the test boards 9 having the tested packages are sequentially pushed out. Accordingly, the socket cover 932 is opened and the package tape PT having a tested package is sequentially wound around the tape winding reel 73b from each of the package sockets 93 while the package tape PT is guided by the tape guide roller 72. At this time, a spacer tape ST is simultaneously drawn out of the tape drawing-out reel 73a on the reel supporting device 73. The spacer tape ST is wound around the tape winding reel 73b together with the package tape PT having the tested package.

When the tensile force for receiving the package tape PT (from each of the package sockets 93 [having the opened socket cover 932] to the tape winding reel 73b) is increased for any reason, the tape guide roller 72 is swung upward and interrupts an optical path between the optical switches 722 and 723 for detecting one set of tape guide rollers 72 and shown in FIG. 10. Thus, a winding operation of the tape winding reel 73b is stopped on the basis of commands from an unillustrated control section. Therefore, the package tape PT is slackened by this stoppage so that the tape guide rollers 72 are swung and lowered. When light is again transmitted along the optical path by these swinging and lowering movements, the winding operation of the tape winding reel 73b is again started. Thus, the package tape PT is safely wound around the tape winding reel 73b such that no package tape PT is not damaged.

When socket cover 932 is not smoothly opened by the latch driving roller 71 and optical switches 711 and 712 [see FIG. 10) for detecting opening states of one set of socket covers 932] do not detect the opening states thereof, the operations of movable constructional portions are stopped on the basis of commands from an unillustrated control section so that safety of the package tape PT is held.

As shown in FIG. 3a, when the tape drawing-out reel 11a becomes empty and the tape winding reel 11b becomes full in the reel supporting device 11 of the tape supplying device 1, a reel supporting arm 113 is rotated and moved to the reel exchanging position so that the reels can be exchanged. As shown in FIG. 12a, when the tape winding reel 73b becomes full and the tape drawing-out reel 73a becomes empty in the reel supporting device 73 in the tape receiver 7, a reel supporting arm 733 is rotated and moved to the reel exchanging position so that the reels can be exchanged.

In accordance with the continuous TCP tester in the above embodiment, a package tape PT can be continuously drawn out in a state in which the package tape PT is elongated without cutting the package tape PT. A large amount of IC packages on the package tape PT can be tested efficiently and safely.

In the above embodiment, the tester is constructed by a continuous TCP tester. However, a portion (especially, the reel supporting device 11) or all of the tape supplying device 1 can be omitted in the continuous TCP tester. Further, a portion (especially, the reel supporting device 73) or all of the tape receiver 7 can be omitted in the continuous TCP tester. For example, an omitted portion can be used by building the omitted portion in a package test process portion on a TCP manufacturing line. In this case, a buffer device using a dancer roller, etc. may be disposed to temporarily store a package tape PT in a process portion prior to the package test process in consideration of a package processing speed in a previous process and a long package testing time required in the package test process.

As mentioned above, a portion (especially, the reel supporting device 11) or all of the tape supplying device 1 can be omitted in the continuous TCP tester. Further, a portion (especially, the reel supporting device 73) or all of the tape receiver 7 can be omitted in the continuous TCP tester. The omitted portions can be used to test packages such as IC packages individually manufactured as a unit by using a test board having a package socket for mounting a unit IC package, etc.

As mentioned above, in accordance with a package tester of the present invention, a large amount of packages on a package tape can be tested efficiently and safely without cutting the package tape.

When a board return device is disposed, an empty test board after the package test can be circulated from an outlet station to an inlet station so that this test board can be efficiently utilized.

The above tester can be used as a continuous TCP tester when a package tape supplying device and a package tape receiver are arranged.

Further, the above tester can be used to test packages such as IC packages individually manufactured as a unit by using a test board having a package socket for mounting a unit package.

Many widely different embodiments of the present invention may be constructed without departing from the spirit and scope of the present invention. It should be understood that the present invention is not limited to the specific embodiments described in the specification, except as defined in the appended claims.

What is claimed is:

1. An apparatus for testing a semiconductor device formed on a carrier tape, comprising:
   an inlet station;
   an outlet station;
   a conveying path connecting said inlet station and said outlet station, said conveying path being moved with said carrier tape;
   an inlet pusher disposed at said inlet station for pushing, with a first force, a test board in a feeding direction along the conveying path by a distance corresponding to a width of said test board, said test board having a package socket mounted thereon for receiving a segment of said carrier tape with said semiconductor device thereon;
   a contacting device positioned in opposed relationship to said conveying path for electrically contacting the pushed test board and for applying an electrical signal to said semiconductor device for performing a test of said semiconductor device for testing purposes;
   a braking device disposed at said outlet station for braking the test board with a second force as the test board is received at the outlet station, the second force being less than the first force; and
   a test board returning device for receiving said test board from said outlet station and returning said received test board to said inlet station.

2. An apparatus according to claim 1, further comprising a tape supplying device disposed above said inlet station for supplying said carrier tape to said test board positioned at said inlet station, and a tape receiving device disposed above said outlet station for receiving said carrier tape from said test board at said outlet station.

3. An apparatus according to claim 2, wherein said tape supplying device comprises:
   a support disposed above said inlet station;
   an arm carried by said support;
   a first reel connected to a first end of said arm for unwinding said carrier tape and a spacer tape superimposed on said carrier tape;
   a second reel connected to a second end of said arm for winding said spacer tape; and
   wherein the arm is movable between an exchanging position and an operation position.

4. An apparatus according to claim 2, wherein said tape receiving device comprises:
   a support disposed above said outlet station;
   an arm carried by said support;
   a first reel connected to a first end of said arm for unwinding a spacer tape superimposed on said carrier tape;
   a second reel connected to a second end of said arm for winding said carrier tape and said spacer tape; and
   wherein the arm is movable between an exchanging position and an operation position.

5. An apparatus according to claim 2, wherein said package socket comprises a socket body, a socket cover and a latch, wherein said apparatus further comprises:
   a latch opening device disposed at said outlet station for opening said socket cover by applying an opening force to said latch thereof;
   a tape guiding member disposed between said latch opening device and said tape receiving device for guiding said carrier tape in accordance with a tension of said carrier tape; and
   a position sensor for detecting a position of said tape guiding member relative to a limit position and for generating a signal when said location sensor detects that said tape guiding member is in a predetermined relationship with said limit position.

6. An apparatus according to claim 1 further comprising a tape supplying device, said tape supplying device comprising:
   a support disposed above said inlet station;
   an arm carried by said support;
   a first reel connected to a first end of said arm for unwinding said carrier tape and a spacer tape superimposed on said carrier tape;
   a second reel connected to a second end of said arm for winding said spacer tape; and
   wherein the arm is movable between an exchanging position and an operation position.

7. An apparatus according to claim 1 further comprising a tape receiving device, wherein said package socket comprises a socket body, a socket cover and a latch, said tape receiving device comprises:
   a support disposed above said outlet station;
   an arm carried by said support;

a first reel connected to a first end of said arm for unwinding a spacer tape superimposed on said carrier tape;

a second reel connected to a second end of said arm for winding said carrier tape and said spacer tape;

wherein the arm is movable between an exchanging position and an operation position;

a latch opening device disposed at said outlet station for opening said socket cover by applying an opening force to said latch thereof;

a tape guiding member disposed between said latch opening device and said tape receiving device for guiding said carrier tape in accordance with a tension of said carrier tape; and a position sensor for detecting a position of said tape guiding member relative to a limit position and for generating a signal when said location sensor detects that said tape guiding member is in a predetermined relationship with said limit position.

8. An apparatus according to claim 7, further comprising an opening sensor for detecting an opening of said socket cover at a predetermined position, the opening sensor generating a signal when said opening sensor detects that said socket cover is closed.

9. An apparatus for testing a semiconductor device formed on a carrier tape, comprising:

an inlet station whereat the carrier tape is received;

an outlet station whereat the carrier tape is discharged;

a test station positioned between the inlet station and the outlet station, the test station having a contact device;

a plurality of test boards, each test board having a plurality of package sockets each mounted thereon for receiving a segment of said carrier tape with said semiconductor device formed thereon, said each semiconductor device being subject to an electrical test when the test board in which it is received is positioned at the test station;

a continuous conveying path for transporting the plurality of test boards in a feeding direction from the inlet station to the test station, from the test station to the outlet station, and from the outlet station to the inlet station;

means for positioning said plurality of test boards at the test station in corresponding alignment along the feeding direction with the contact devices; and a test board returning device for receiving each of said test boards from said outlet station and returning said received test board to said inlet station.

10. An apparatus according to claim 9, wherein a plurality of test boards are conveyed abreast of one another along the conveying path in a direction perpendicular to the feeding direction.

11. An apparatus for testing a semiconductor device formed on a carrier tape, comprising:

an inlet station;

an outlet station;

a conveying path for conveying the carrier tape from the inlet station and the outlet station;

at least one test board disposed along the conveying path for engaging the carrier tape upon which the semiconductor device is formed;

a test station whereat an electrical signal is applied to the semiconductor device for testing the semiconductor device when the test board is registered at a predetermined position at the test station;

an inlet pusher for applying a pushing force to the test board;

a reaction pusher for applying a reaction force to the test board, the reaction force being in a opposite direction to the pushing force, the pushing force and reaction force being coordinated so that the test board is registered at the predetermined position at the test station.

12. The apparatus of claim 11, wherein the inlet pusher pushes the test board in a feeding direction along the conveying path by a distance corresponding to a width of said test board.

13. The apparatus of claim 11, wherein the test board has a package socket mounted thereon for receiving a segment of said carrier tape with said semiconductor device thereon.

14. The apparatus of claim 11, further comprising a test board returning device for receiving said test board from said outlet station and returning said received test board to said inlet station.

15. The apparatus of claim 11, wherein the test board has a first surface whereupon the tape carrier is engaged and an opposing second surface, the second surface having a plurality of holes formed therein, a first of the holes being engaged by the inlet pusher and a second of the holes engaged by the reaction pusher.

16. The apparatus of claim 11, further comprising a tape supplying device disposed above said inlet station for supplying said carrier tape to said test board positioned at said inlet station, and a tape receiving device disposed above said outlet station for receiving said carrier tape from said test board at said outlet station.

17. The apparatus of claim 11, wherein said test board has a package socket mounted thereon for receiving a segment of the carrier tape with said semiconductor device thereon, and wherein said package socket comprises a socket body, a socket cover and a latch.

* * * * *